(12) United States Patent
Huffman

(10) Patent No.: US 10,510,399 B2
(45) Date of Patent: Dec. 17, 2019

(54) LOW POWER SRAM BITCELL USING RESONANT DRIVE CIRCUITRY

(71) Applicant: Power Down Semiconductor Inc., Fremont, CA (US)

(72) Inventor: David A. Huffman, Fremont, CA (US)

(73) Assignee: Power Down Semiconductor Inc., Fremont, CA (US)

( * ) Notice: Subject to any disclaimer, the term of this patent is extended or adjusted under 35 U.S.C. 154(b) by 0 days.

(21) Appl. No.: 15/746,615

(22) PCT Filed: Jul. 26, 2016

(86) PCT No.: PCT/US2016/044126
§ 371 (c)(1),
(2) Date: Jan. 22, 2018

(87) PCT Pub. No.: WO2017/019715
PCT Pub. Date: Feb. 2, 2017

(65) Prior Publication Data
US 2018/0218768 A1    Aug. 2, 2018

Related U.S. Application Data

(60) Provisional application No. 62/282,215, filed on Jul. 27, 2015.

(51) Int. Cl.
*G11C 7/00* (2006.01)
*G11C 11/419* (2006.01)
(Continued)

(52) U.S. Cl.
CPC .......... *G11C 11/419* (2013.01); *G11C 7/065* (2013.01); *G11C 7/12* (2013.01); *G11C 11/412* (2013.01); *H01L 27/11* (2013.01)

(58) Field of Classification Search
CPC ..... G11C 11/419; G11C 11/412; G11C 7/065; G11C 7/12; G11C 7/11
(Continued)

(56) References Cited

U.S. PATENT DOCUMENTS 5,301,146 A    4/1994    Hama
5,734,285 A    3/1998    Harvey
(Continued)

FOREIGN PATENT DOCUMENTS

WO    99/34368 A1    7/1999
WO    03/088459 A2    10/2003

OTHER PUBLICATIONS

Jianping Hu et al., "A Novel Low-Power Adiabatic SRAM with an Energy-Efficient Line Driver", Communications, Circuits and Systems, 2004, ICCCAS 2004.
(Continued)

*Primary Examiner* — Connie C Yoha

(57) ABSTRACT

An SRAM cell comprises a first inverter having an output lead coupled to the input lead of a second inverter via a first resistor. The output lead of the second inverter is coupled to the first inverter input lead via a second resistor. A first write bit line is coupled to the first inverter input lead via a first switch, and a second write bit line is coupled to the second inverter input lead via a second switch. Because of the resistors, the circuitry driving write bit lines does not have to overpower the inverters when writing data to the cell. The cell is part of an array comprising several columns of SRAM cells, each column coupled to a pair of write bit lines. A resonating oscillator drives the write bit lines with a sine wave. This reduces the power consumed by the SRAM array.

32 Claims, 16 Drawing Sheets

(51) Int. Cl.
　　　*G11C 11/412* (2006.01)
　　　*G11C 7/06* (2006.01)
　　　*G11C 7/12* (2006.01)
　　　*H01L 27/11* (2006.01)

(58) Field of Classification Search
　　　USPC .................. 365/189.11, 154, 189.04, 189.05
　　　See application file for complete search history.

(56) References Cited

U.S. PATENT DOCUMENTS

| | | | |
|---|---|---|---|
| 5,781,469 A | 7/1998 | Pathak et al. | |
| 5,905,290 A | 5/1999 | Houston | |
| 5,936,598 A * | 8/1999 | Hayama | G09G 3/3674 345/76 |
| 6,044,035 A | 3/2000 | Kohno | |
| 7,183,868 B1 | 2/2007 | Wessendorf | |
| 7,304,895 B2 | 12/2007 | Joshi et al. | |
| 7,307,871 B2 | 12/2007 | Liaw | |
| 7,746,921 B1 * | 6/2010 | Wik | H03K 17/693 327/108 |
| 2003/0039165 A1 * | 2/2003 | Shau | G11C 7/06 365/230.03 |
| 2004/0052147 A1 * | 3/2004 | McLaury | G11C 8/16 365/230.05 |
| 2004/0252546 A1 | 12/2004 | Liaw | |
| 2005/0248977 A1 * | 11/2005 | Liaw | G11C 7/02 365/154 |
| 2007/0063252 A1 | 3/2007 | Yuan | |
| 2008/0205112 A1 | 8/2008 | Lawson et al. | |
| 2009/0059697 A1 | 3/2009 | Adams et al. | |
| 2010/0165779 A1 | 7/2010 | Zhang | |
| 2012/0266002 A1 | 10/2012 | Kim | |

OTHER PUBLICATIONS

Joohee Kim et al., "Energy Recovering Static Memory", ISLPED '02, Aug. 12-14, 2002, Monterey, CA.

Nestoras Tzartzanis et al., "Energy Recovery for the Design of High-Speed, Low-Power Static RAMs", ISLPED 1996 Monterey, CA. Low Power Electronics and Design, Aug. 1996.

Jianping Hu et al., "Low Power Dual Transmission Gate Adiabatic Logic Circuits and Design of SRAM", the 47th IEEE International Midwest Symposium on Circuits and Systems. 2004.

Dragan Maksimovic et al., "Integrated Power Clock Generators for Low Energy Logic", Power Electronics Specialists Conference, Jun. 18-22, 1995, PESC '95 Record, 26th Annual IEEE.

European Search Report (from a corresponding foreign application), EP16831256.9, dated Feb. 20, 2019.

* cited by examiner

LOW POWER SRAM BITCELL USING RESONANT DRIVE CIRCUITRY

CROSS-REFERENCE TO RELATED APPLICATIONS

This application claims the benefit of priority to U.S. Provisional Application Ser. No. 62/282,215, entitled "A Low Power SRAM Bitcell Using Resonant Drive Circuitry," filed Jul. 27, 2015, the contents of which are incorporated by reference.

BACKGROUND OF THE INVENTION

This invention relates to integrated circuits, and in particular, to static random access memory (SRAM) circuits. This invention also relates to methods and circuits for storing data in SRAM circuits.

There are two general types of memory circuits: "volatile" and "nonvolatile". Volatile memory loses its stored information when power is removed from the circuit whereas nonvolatile memory retains its stored information even when power is disconnected from the circuit. Within the "volatile" memory category, there are also two main types: "static" random access memory (or SRAM) and "dynamic" random access memory (or DRAM). Once data is written into an SRAM memory cell it remains available for reading as long as power is supplied to the circuitry. Conversely, a DRAM memory cell requires constant refreshing in order for its data to remain available for reading. If a refresh cycle does not occur within a certain period of time, the data is lost and cannot be recovered.

Examples of publications describing SRAM cells include:
1. Jianping Hu et al., "A Novel Low-Power Adiabatic SRAM with an Energy-Efficient Line Driver," International Conference on Communications, Circuits and Systems, June 2004, p. 1151 (hereafter "Publication 1)".
2. Joohee Kim et al., "Energy Recovering Static Memory," International Symposium on Low Power Electronics and Design, August 2002, p. 92.
3. Jianping Hu et al., "Low Power Dual Transmission Gate Adiabatic Logic Circuits and Design of SRAM," Midwestern Symposium on Circuits and Systems, 2004, p. 1-565.
4. Nestoras Tzartzanis et al., "Energy Recovery for the Design of High-Speed, Low-Power Static RAMs," International Symposium on Low Power Electronics and Design, 1996.
5. Joohee Kim et al., PCT Patent Application WO 03/088459, entitled "Low-Power Driver with Energy Recovery", Oct. 23, 2003.

It is common for computer integrated circuit chips (or ICs) to have SRAM embedded within them in order to store data locally and make that data available for processing at some future time. This embedded memory operates significantly faster than "off chip" external memory when communicating with the processor. Some computer chips (typically called microprocessor units or MPUs) only have embedded memory (both volatile and nonvolatile). Many of these MPU chips are used in battery-powered mobile, wearable or surgically-implantable applications where power consumption must be minimized for cost and/or performance reasons.

FIG. 1 shows a common architecture for an SRAM cell 1 whereby two inverters INV1, INV2 are connected in a feedback loop which allows 360 degrees of phase inversion. 360 degrees of phase inversion is also called "positive feedback" and creates a regenerative effect whereby cell 1 is stable in a state that has the positive supply rail voltage of the inverters on one of the internal nodes X, Xn and the negative supply rail voltage on the other internal node Xn, X. For example, assuming both switches S0 and S1 are open, if node X is at a logical 1 then node Xn is at a logical 0. If both nodes X, Xn are driven to a logical 1 simultaneously, or driven to a logical 0 simultaneously, cell 1 is unstable and will transition to a stable state whereby only one of nodes X, Xn is at a logical 1 and the other node Xn, X is at a logical 0. Cell 1 remains in this state as long as a new value is not written into cell 1 and cell 1 remains powered up to an adequate voltage level. When it is desired to store new data in SRAM cell 1, switches S0 and S1 are closed to sample bit lines BIT and BITn. As can be seen in FIG. 1, bit lines BIT and BITn are driven by tristate drivers DRV, DRVn with data signals DATA and DATAn, respectively, when a write enable signal WE is asserted.

FIG. 2 shows the transistor-level equivalent of SRAM cell 1 wherein switches S0 and S1 are implemented as NMOS transistors MN0 and MN1 and inverters INV1 and INV2 are implemented with transistors MN2, MN3, MP2 and MP3. Transistors MN0 and MN1 are controlled by a write word line WORD. When switches S0 and S1 are closed (or equivalently transistors MN0 and MN1 are on) to write data into cell 1, the output leads of inverters INV1 and INV2 are "back-driven" in order for SRAM cell 1 to switch states (assuming the new data to be stored in cell 1 is the opposite of the data previously stored in cell 1). When SRAM cell 1 is back-driven, current is consumed by inverters INV1, INV2 until they finish transitioning to the new state. FIG. 3 shows how this occurs. (The symbols for the transistors in FIG. 3 have been modified to show the on-resistances.) First, drivers DRV, DRVn drive bit lines BIT, BITn to the logical values that SRAM cell 1 will store in the next write cycle. In this case it is assumed that node X is at a logical 0 and node Xn is at a logical 1 before the write cycle. Bit lines BIT and BITn are first driven to logical 1 and 0 respectively. (A logical 1 is assumed to correspond to voltage "VDD" in this case). After the voltages on bit lines BIT, BITn have settled, word line WORD is pulsed, thereby switching on transistors MN0 and MN1. This example assumes a switch resistance of 2000 ohms when either switching transistor MN0, MN1 is in the "on" state. This example also assumes an "on" switch resistance of 10,000 ohms for transistor MN2 and 20,000 ohms for transistor MP3. (Transistors MN3 and MP2 are "off" at the beginning of the write cycle and have very large resistance values of approximately 10,000,000,000 ohms each when off.) The initial source current (I-Source) in FIG. 3 is given by:

$$I\text{-Source}=VDD/(10K+2K)$$

If VDD equals 1V then I-Source=83.4 uA. The sink current (I-Sink) on the opposite side of the cell will be given by:

$$I\text{-Sink}=VDD/(20K+2K)$$

Again, if VDD equals 1V then I-Sink equals 45.4 uA. This example does not take into consideration the output resistance of the bit line drivers DRV, DRVn which is assumed here to be approximately zero ohms. This is a reasonable approximation given that the SRAM switch and inverter device resistances are typically much larger than the bit line driver resistance.

The I-Source and I-Sink currents cause power consumption during write operations. Such power consumption is undesirable.

Another source of power consumption lies in the fact that SRAM cells are typically arranged in arrays comprising rows and columns of cells, each column being accessed by a pair of bit lines (e.g. lines BIT, BITn in FIGS. 1 to 3). Owing to the length of the bit lines, the bit lines tend to be highly capacitive. Voltage on bit lines BIT, BITn is raised and lowered by the transistors MN5, MN6, MP5, MP6 within drivers DRV, DRVn. During the process of raising and lowering the voltage on bit lines BIT, BITn, and charging and discharging the bit line capacitance, power is consumed by transistors MN5, MN6, MP5 and MP6 as they transition from on to off or from off to on. (The capacitance associated with bit lines BIT, BITn is symbolically illustrated as capacitors C, Cn, respectively.) It would be desirable to reduce such power consumption.

SUMMARY

One object of an embodiment of the present invention is to provide an SRAM exhibiting reduced power consumption.

In one embodiment, an SRAM cell comprises first and second inverters. The output lead of the first inverter is coupled to the input lead of the second inverter via a first resistor. Similarly, the output lead of the second inverter is coupled to the input lead of the first input lead via a second resistor. A first write lead is coupled to a first node between the first resistor and the input lead of the second inverter. The first write lead provides a first data signal to be stored in the SRAM cell. Because of the first resistor, a circuit driving the first write lead with that first data signal does not have to "overpower" the first inverter when writing that data into the SRAM cell. Thus, write operations are accomplished using less power than would otherwise be required.

Typically, a second write lead is coupled to a second node between the second resistor and the input lead of the first inverter. The second write lead provides a second data signal that is the opposite of the first data signal. Because of the second resistor, the circuit driving the second write lead does not have to "overpower" the second inverter when providing the second data signal. Thus, again, write operations are accomplished using less power than would otherwise be required.

Typically, a first switch is provided between the first write lead and the first node, and a second switch is coupled between the second write lead and the second node to facilitate coupling and decoupling the SRAM cell from the first and second write leads.

Typically, the SRAM cell is part of an array of rows and columns of SRAM cells. The first and second write leads are write bit lines for writing data into a column of SRAM cells. A write word line controls the state of the first and second switches, and thereby controls when data is stored in the SRAM cell.

In one embodiment, the SRAM cell comprises a third switch for selectively coupling the output lead of the first inverter to a first read bit line and a fourth switch for selectively coupling the output lead of the second inverter to a second read bit line. The first and second read bit lines are used to read data from the column of SRAM cells.

In accordance with one embodiment of the invention, first and second write bit lines are selectively coupled to an SRAM cell to perform write operations. A resonant circuit is coupled to alternatively drive either the first (or second) write bit line with a sine wave while the second (or first) write bit line is held at a constant value. The constant value typically corresponds to a binary logic level (e.g. a binary 0).

When it is desired to write a new value into the SRAM cell, the write bit lines are coupled to the SRAM cell during a time period in which the sine wave is at a voltage opposite that constant value, and then decoupled from the SRAM cell, thereby leaving the SRAM cell in a desired state. For example, in one embodiment, the constant value is a binary 0, and the first and second bit lines are coupled to the SRAM cell when the sine wave is at a voltage corresponding to a binary 1. Thereafter the bit lines are decoupled from the SRAM cell.

When it is desired to again change the state of the SRAM cell, the resonant circuit is decoupled from the first bit line at a time when the sine wave voltage is equal to the constant value, and then coupled to the second bit line. The first and second bit lines are then coupled to the SRAM cell at a time when the sine wave has reached the voltage opposite the constant value.

Of importance, because the bit lines are driven by a resonant circuit, less power is consumed than would be the case if the bit lines were charged and discharged by pull-up and pull-down transistors during write operations.

In one embodiment, a weak "keeper cell" is coupled to the bit lines to maintain them at the constant value when they are not driven by the resonant circuit.

DETAILED DESCRIPTION

SRAM Cell

Figure 4:
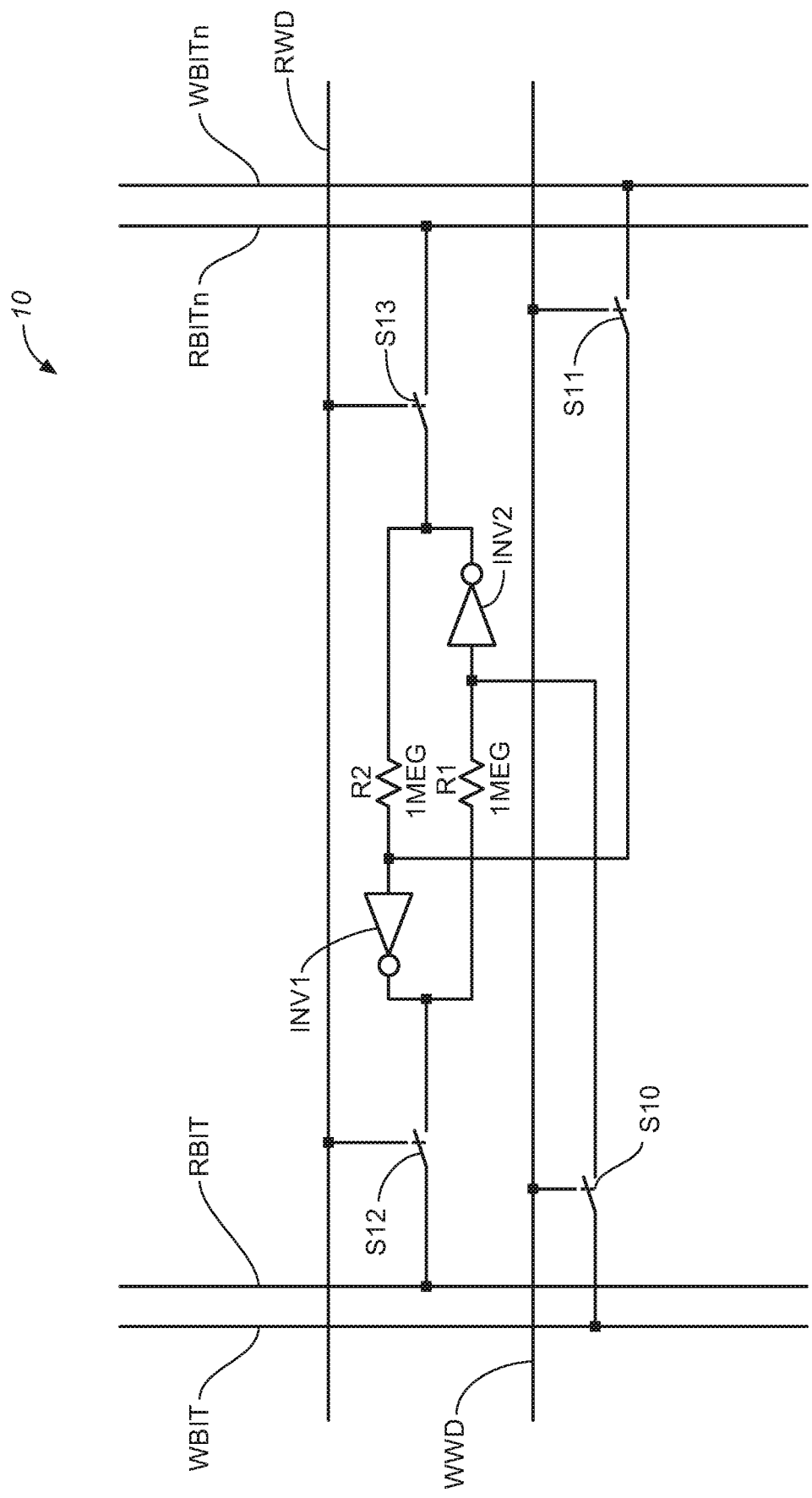
FIG. 4 is a simplified block diagram of a low-power SRAM cell in accordance with my invention.

FIG. 4 shows a novel SRAM cell 10 in accordance with the invention with separate read bit lines RBIT, RBITn and write bit lines WBIT, WBITn. Cell 10 also includes a separate read word line RWD and a write word line WWD to control read and write operations. When it is desired to write data to cell 10, appropriate data is provided on write bit lines WBIT, WBITn, and then write word line WWD is pulsed to load the data from bit lines WBIT, WBITn into cell 10 via switches S10, S11. When it is desired to read the contents of cell 10, read word line RWD is pulsed, and data is loaded from cell 10 via switches S12, S13 to read bit lines RBIT, RBITn, which drive a sense amplifier (not shown in FIG. 4). In addition to the split read and write bit lines, resistors R1 and R2 are coupled from each inverter's output lead to the opposite inverter's input lead within SRAM cell 10. Resistors R1, R2 limit the sink and source currents as cell 10 transitions from one state to another state.

Figure 5:
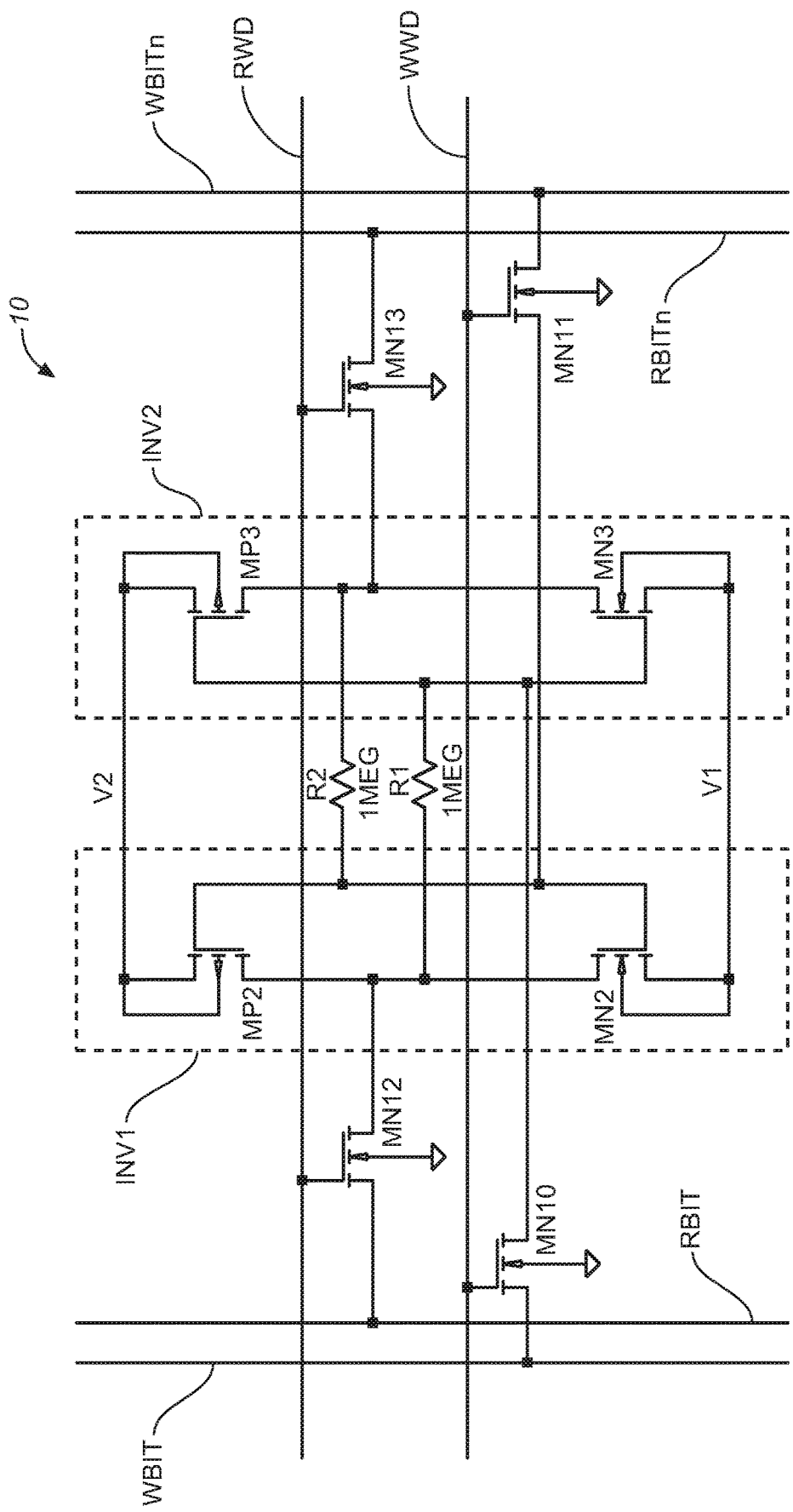
FIG. 5 schematically illustrates the SRAM cell of FIG. 4 in transistor-level detail.

A transistor-level representation of cell 10 is shown in FIG. 5. The rail voltage supplies for cell 10 are designated as V2 and V1 for the logic high and logic low voltages, respectively. Transistors MN10, MN11, MN12 and MN13 perform the function of switches S10, S11, S12 and S13, respectively.

Figure 6:
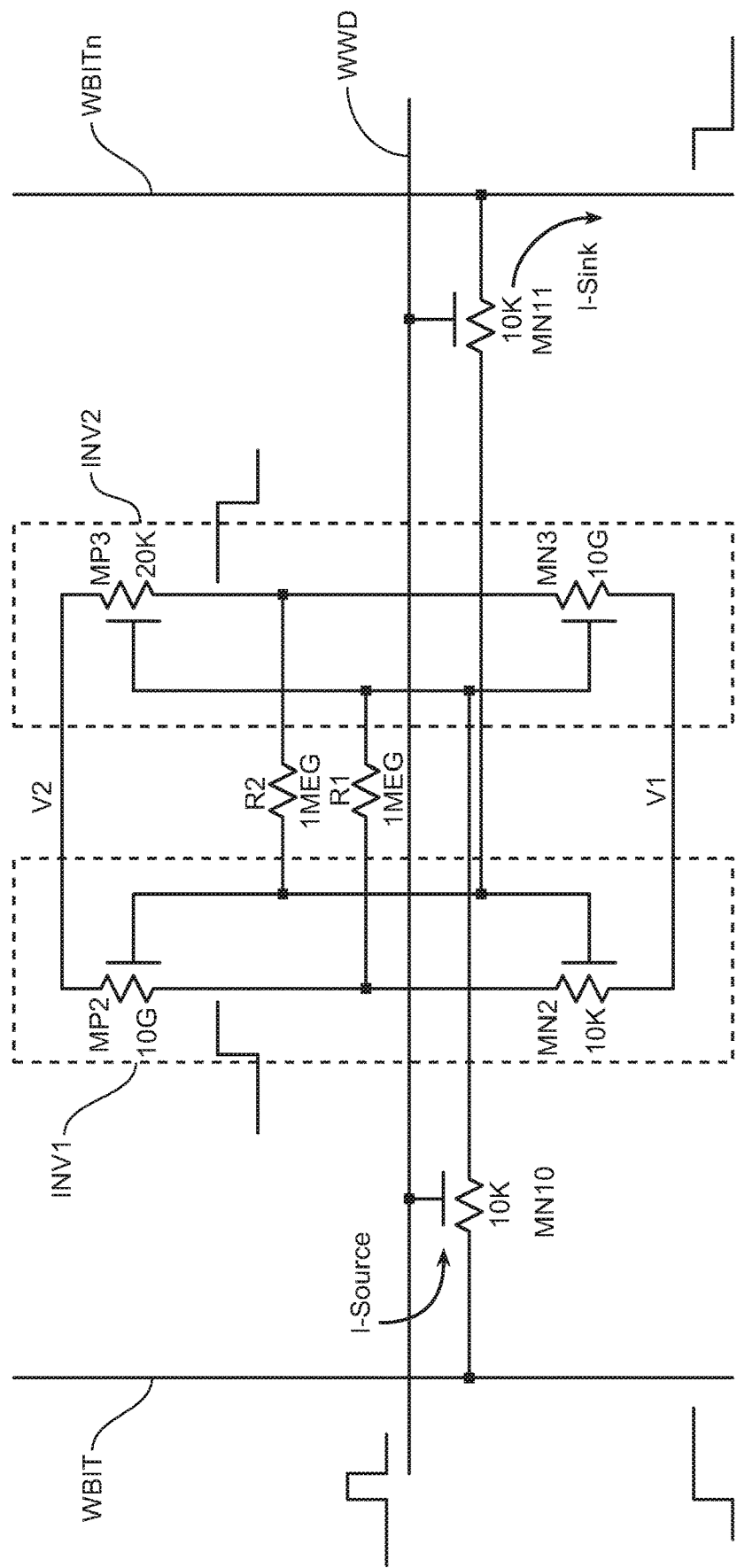
FIG. 6 schematically illustrates the SRAM cell of FIG. 4 at the beginning of a write cycle with transistors modelled as voltage-controlled resistors.

FIG. 6 shows the sink (I-Sink) and source (I-Source) currents which must pass through resistors R1 and R2. (Transistors MN12 and MN13 and leads RBIT RBITn and RWD are not shown in FIG. 6 for ease of illustration and clarity.) The source current is now given by:

$$I\text{-Source}=(V2-V1)/(10K+1MEG+10K)$$

If V2 equals 1 volt and V1 is ground then I-Source equals 980 nA. The sink current (I-Sink) on the opposite side of the cell will be given by:

$$I\text{-Sink}=(V2-V1)/(20K+1MEG+10K)$$

Again, if V2 equals 1 volt and V1 is ground then I-Sink equals 972 nA. As can be seen, these I-Source and I-Sink values are much less than the corresponding values for prior art cell 1 discussed above. Thus, cell 10 consumes less power than cell 1.

Figure 3:
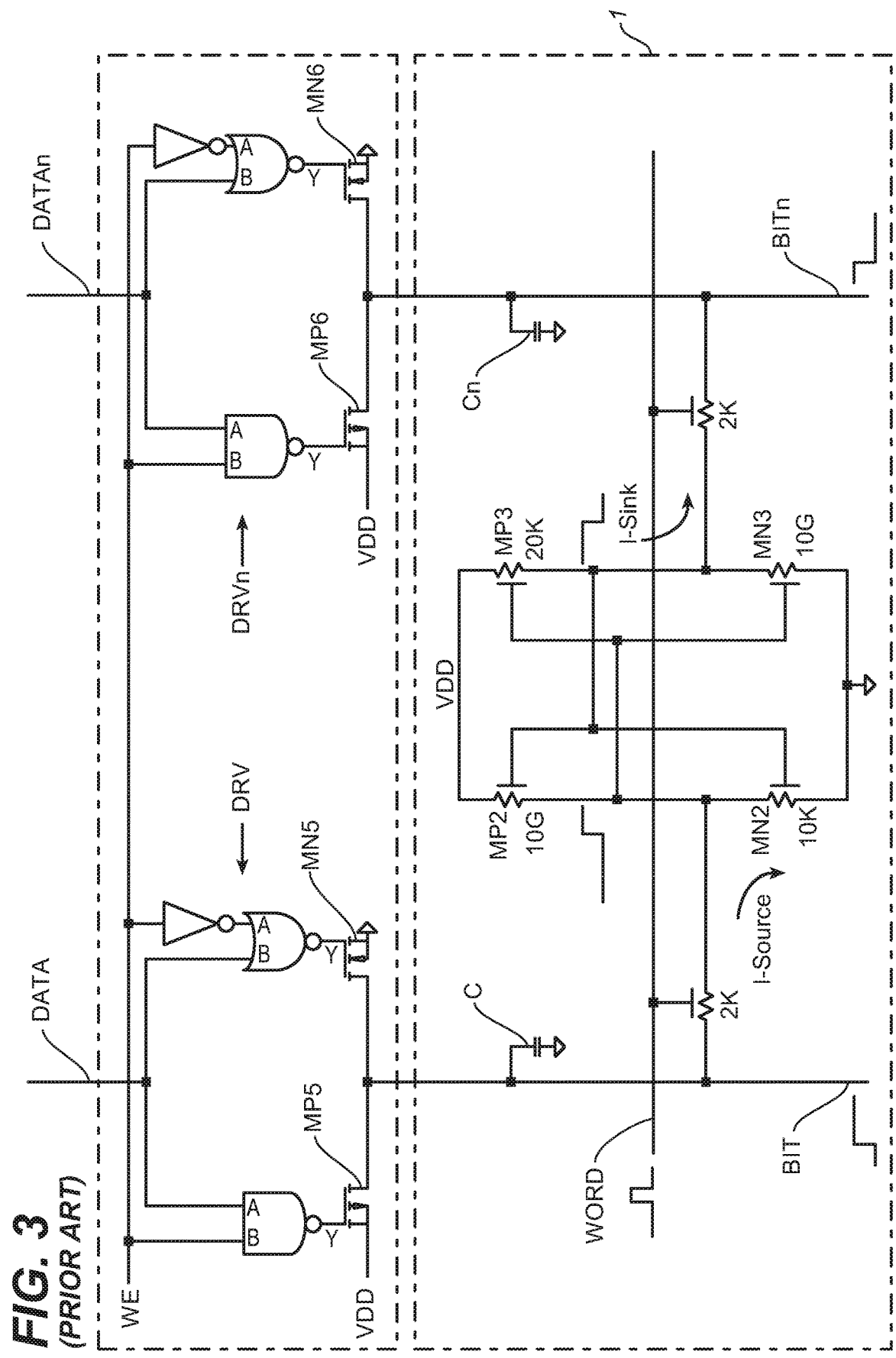
FIG. 3 schematically illustrates the SRAM cell of FIG. 1 at the beginning of a write cycle with transistors modelled as voltage-controlled resistors.

In the novel SRAM cell example the on-resistance of transistors MN10 and MN11 are 10K ohms rather than 2K ohms in the prior art example. This is because transistors MN10, MN11 for novel SRAM cell 10 can be smaller than transistors MN0, MN1 in prior art cell 1. The reason for this is as follows. In order to cause SRAM cell 1 to flip state, the voltage on node X of FIG. 3 must reach the trip voltage (also referred to as the "threshold" voltage) of the inverter comprising transistors MN3 and MP3. Conversely, the voltage on node Xn should be pulled below the threshold voltage of the inverter comprising transistors MN2 and MP2. Nodes X and Xn typically will not arrive at their respective threshold voltages simultaneously as they transition and hence the side that arrives at the threshold voltage first assists the opposite side to regenerate and flip the state of SRAM cell 1. If transistor MN0 (or MN1) in FIG. 3 is not large enough such that the resistor divider comprising the on resistance of transistors MN0 and MN2 (or the resistor divider comprising the on resistance of transistors MN1 and MP3) allows node X (or Xn) to cross the threshold voltage of inverter INV2 (or inverter INV1), SRAM cell 1 will be unable to change state.

SRAM cell 10 does not have this "resistor divider" problem with respect to reaching the threshold of inverters INV1, INV2 since the impedance looking into write bit lines WBIT, WBITn of FIG. 6 is very high compared to the impedance of transistors MN0, MN1 due to the 1 megohm resistors R1, R2 added between the inverters.

The resistance and voltage values discussed above are merely exemplary. SRAM cells constructed in accordance with other embodiments can use other resistance and voltage values.

Resistors R1 and R2 can be implemented in any of a number of ways. In one embodiment, they can be polycrystalline silicon resistors. In another embodiment, they can be implemented using a JFET.

SRAM Cell Incorporated into an Array

Figure 7:
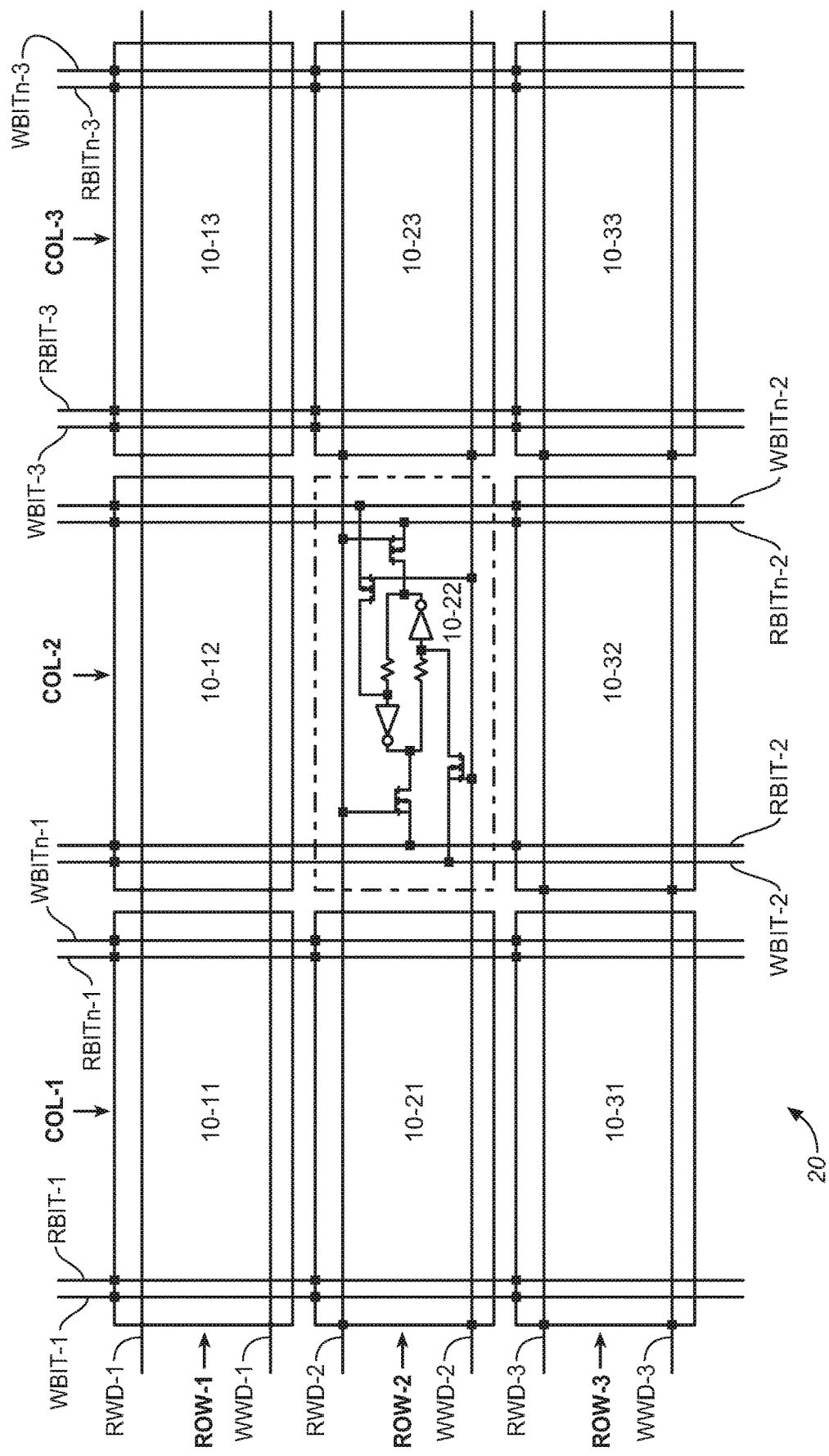
FIG. 7 illustrates a portion of an SRAM cell array comprising SRAM cells in accordance with my invention.

SRAM cells in accordance with the invention are typically incorporated into an array such as array 20 in FIG. 7. Cells 10-11 to 10-33 of array 20 are organized into horizontal rows and vertical columns of SRAM cells, each column being associated with a pair of write bit lines and a pair of read bit lines. For example, column COL-2 of SRAM cells are associated with write bit lines WBIT-2, WBITn-2 and read bit lines RBIT-2, RBITn-2. Write bit lines WBIT-2, WBITn-2 perform the same function for the cells 10-12, 10-22, 10-32 of column COL-2 as lines WBIT, WBITn perform for cell 10 in FIG. 4 above. Similarly, read bit lines RBIT-2, RBITn-2 perform the same function for the cells in column COL-2 as lines RBIT, RBITn perform for cell 10 of FIG. 4. The other write bit lines WBIT-1, WBITn-1, WBIT-3, WBITn-3 and read bit lines RBIT-1, RBITn-1, RBIT-3, RBITn-3 perform the same functions for their associated columns of cells COL-1, COL-3. Although only three columns and three rows of SRAM cells are shown in FIG. 7, in other embodiments, other numbers of rows and columns (typically more than three) are present.

Each row of cells in array 20 is associated with a write word line and a read word line. For example, row ROW-2 of cells 10-21, 10-22 and 10-23 are associated with a write word line WWD-2 and a read word line RWD-2. Word line WWD-2 performs the same function for cells 10-21, 10-22 and 10-23 as word line WWD performs for cell 10 above, and read word line RWD-2 performs the same function for cells 10-21, 10-22 and 10-23 as line RWD for cell 10 above. Write word lines WWD-1 and WWD-3 and read word lines RWD-1, RWD-3 perform these functions for rows ROW-1 and ROW-3, respectively.

An SRAM typically receives an address for selecting a row of cells within the SRAM array for reading and writing, e.g. from a microprocessor or other device. The SRAM typically comprises an address decoder for generating control signals, e.g. for selecting a particular word line RWD, WWD that is to be pulsed during a read or write operation. In one such embodiment, a row of cells within array 20 is accessed during a read or write operation. (Alternatively, in other embodiments, the address decoder can also select one or more columns of SRAM cells to be accessed during a read or write operation.) In one embodiment, an array in accordance with the invention can be used in conjunction with an address decoder such as described in my U.S. Provisional Patent Application entitled "A Low Power Decoder Using Resonant Drive Circuitry", filed Jul. 27, 2015 (Ser. No. 62/282,214) and incorporated herein by reference. Alternatively, other address decoders can also be used.

Driving the Write Bit Lines with a Resonant Circuit

Figure 8:
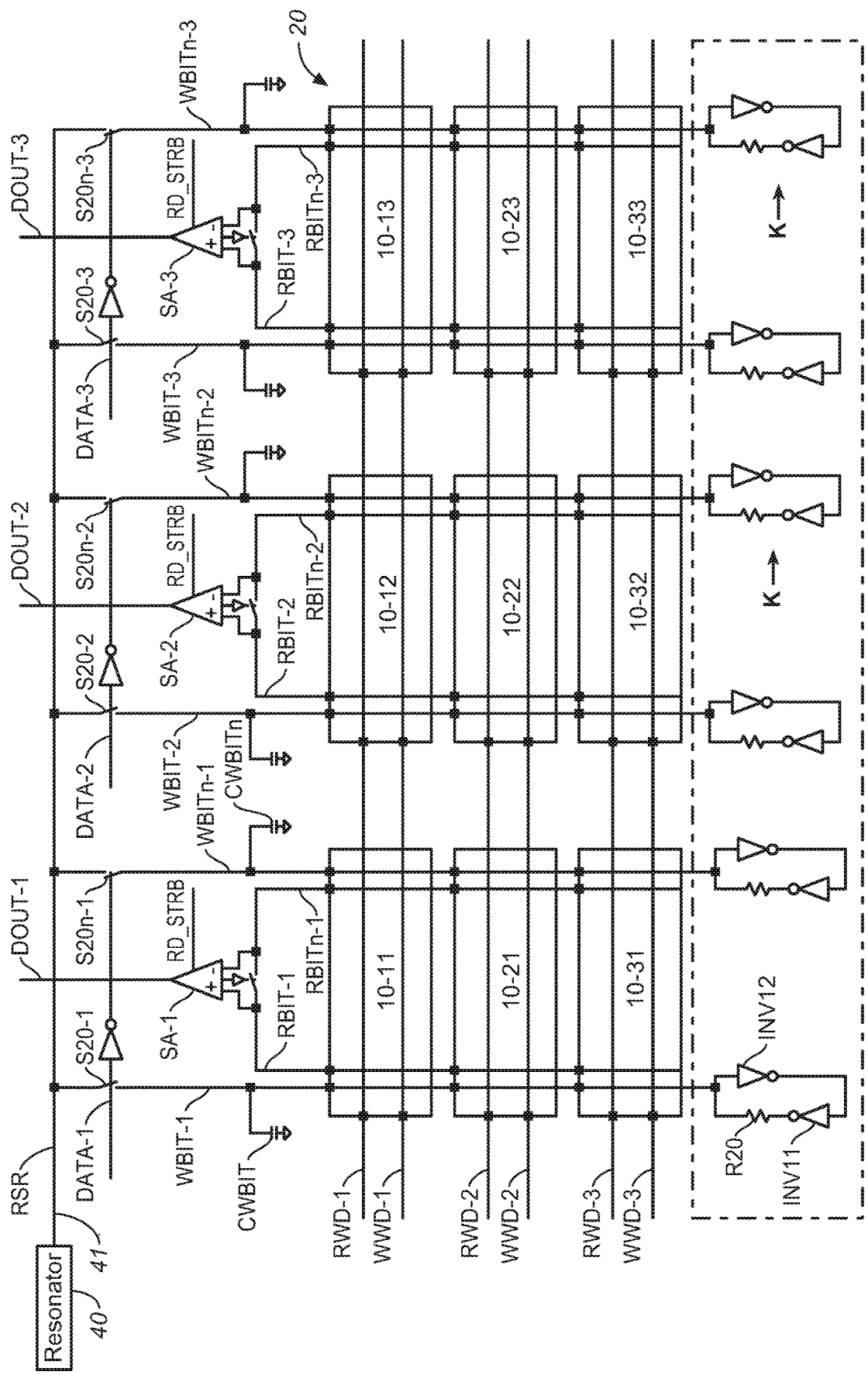
FIG. 8 illustrates a resonant circuit and a set of keeper circuits coupled to an array of SRAM cells in accordance with an embodiment of my invention.

In accordance a novel feature of one embodiment of my invention, a resonant circuit 40 provides a resonating signal RSR (typically sinusoidal) which drives selected write bit lines WBIT, WBITn of array 20 (FIG. 8). Resonating signal RSR is applied to a selected one of write bit lines WBIT, WBITn within a pair of bit lines to communicate a binary one on that selected write bit line, whereas a DC voltage corresponding to a binary 0 is applied to the other write bit line WBITn, WBIT within the pair to communicate a binary 0. For reasons described below, this further reduces the power consumed by an SRAM constructed in accordance with this embodiment of my invention.

Referring to FIG. 8, resonating signal RSR is applied to write bit lines WBIT-1 to WBIT-3 and WBITn-1 to WBITn-3 via switches S20-1 to S20-3 and S20n-1 to S20n-3, respectively. Whether resonant circuit 40 drives write bit line WBIT-1 or WBITn-1 with signal RSR depends on the logic state of data signal DATA-1. Data signal DATA-2 similarly controls whether resonant circuit 40 drives write bit line WBIT-2 or WBITn-2 with signal RSR, and data signal DATA-3 controls whether resonant circuit 40 drives write bit line WBIT-3 or WBITn-3 with signal RSR. (Data signals DATA-1 to DATA-3 are provided from outside SRAM array 20, e.g. by a device such as a microprocessor.)

Write word lines WWD are only pulsed when signal RSR is at or near its peak voltage (corresponding to a binary 1 voltage). Therefore, for example, cell 10-22 is only coupled to write bit line WBIT-2, WBITn-2 when simultaneously a) one of bit lines WBIT-2, WBITn-2 carries signal RSR, b) signal RSR is at or near a binary one voltage level, and c) the other bit line WBITn-2, WBIT-2 is carrying a binary 0 voltage level. Thus, when a word line WWD is pulsed, the row of cells corresponding to that word line receives appropriate binary voltages corresponding to data values to be stored in those cells. The pulse on the selected word line WWD is narrow, and only occurs at or near the peaks of resonating signal RSR, thereby allowing the largest differential voltage to be presented to the SRAM cells and thereby minimizing the chances of writing an erroneous value to the SRAM cells.

Switches S20-1 to S20-3 and S20n-1 to S20n-3 only switch when signal RSR is at its lowest voltage (corresponding to a binary 0 voltage). This prevents discontinuities from appearing in the waveform of signal RSR and provides a clean transition from one set of bit lines to the other.

A set of keeper circuits K comprising pairs of inverters INV11 and INV12 and resistor R20 are coupled to associated write word lines WBIT-1 to WBIT-3 and WBITn-1 to WBITn-3. Keeper circuits K keep their associated write bit lines at a DC binary zero voltage level when resonant circuit 40 is no longer driving them. Inverter INV11 is "weak", i.e. the transistors within inverter INV11 (not shown) are typically very resistive when on. Keeper circuits K typically draw only a very small current to overcome leakage current, e.g. about 2 nA. Thus, very little power is consumed even when keeper circuits K and resonant circuit 40 simultaneously drive a word line.

Figure 9:
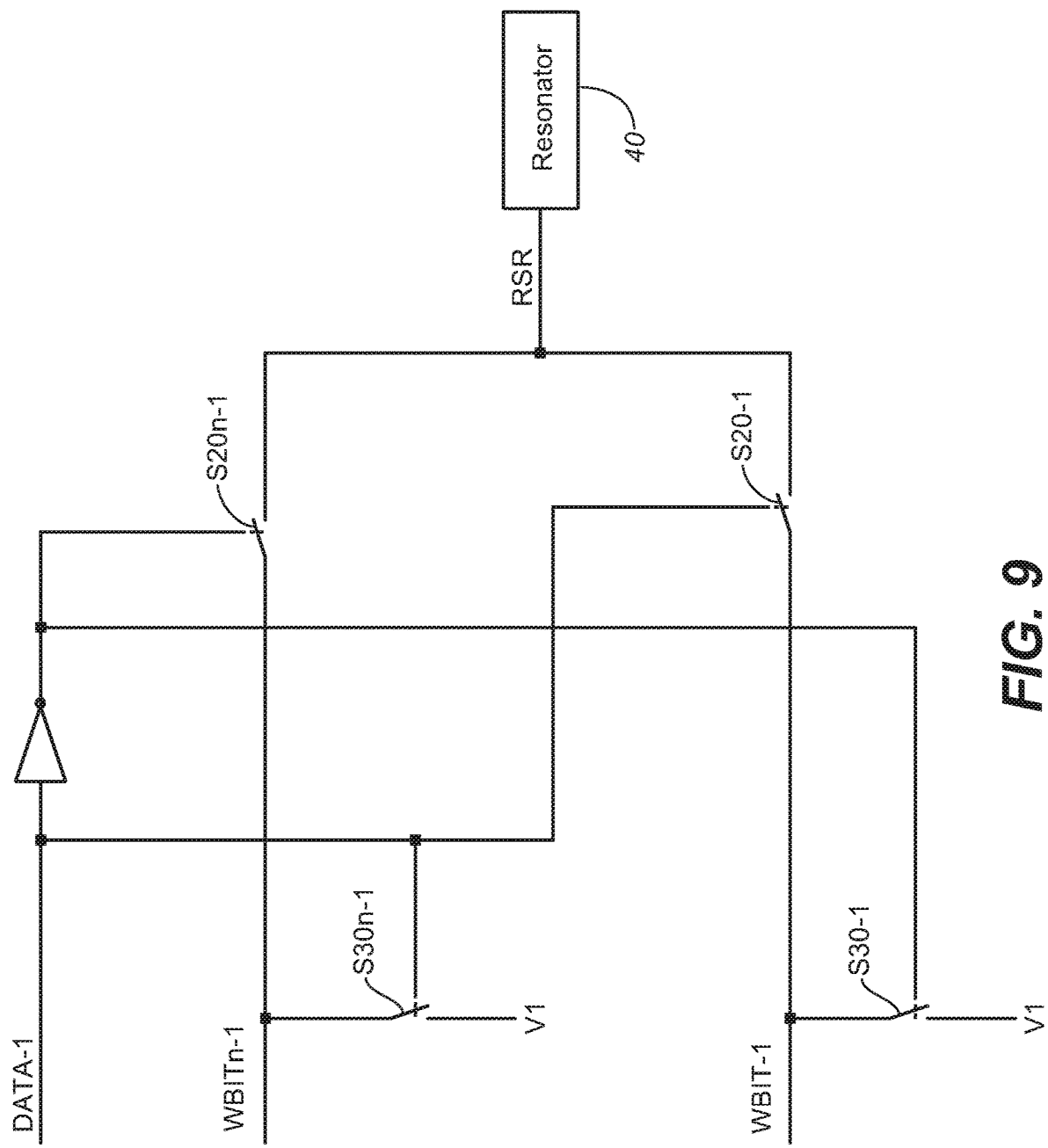
FIG. 9 illustrates an embodiment of a set of switches for holding bit lines at a selected binary voltage level when they are not being driven by a resonant circuit.

In other embodiments, other devices can be used in lieu of inverters INV11 and INV12 and resistor R20 for keeper circuits K. For example, in one embodiment a set of switches S30-1, S30n-1 (FIG. 9) maintains lines WBIT-1 and WBITn-1 at a binary zero voltage level (voltage V1) when lines WBIT-1 and WBITn-1 are not coupled to receive signal RSR. Switch S30-1 is controlled by data signal DATA-1, and switch S30n-1 is controlled by the logical inverse of data signal DATA-1. Similar switches hold bit lines WBIT-2, WBITn-2, WBIT-3 and WBITn-3 at a binary 0 voltage level (voltage V1) when they are not driven with signal RSR, Alternatively, a large resistor can be provided between lines WBIT, WBITn and voltage V1. Such a resistor will not draw significant current when signal RSR is high and applied to lines WBIT, WBITn, but will suffice to keep lines WBIT, WBITn at a binary zero voltage level when they are not coupled to receive signal RSR.

Figure 10:
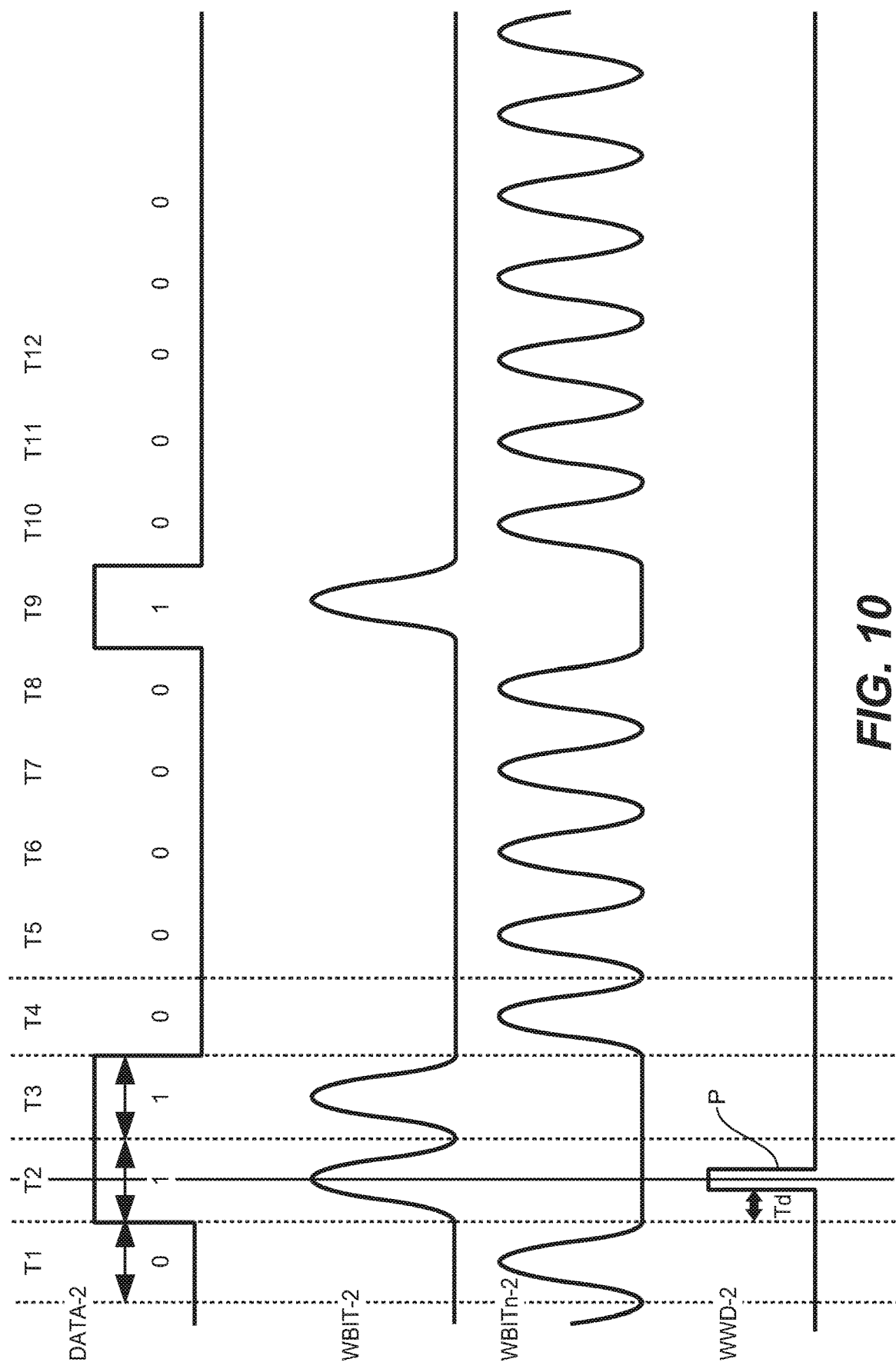
FIG. 10 is a timing diagram showing a data signal, bit line signals and a word line pulse applied to a cell in the array of FIGS. 8 and 9.

FIG. 10 is a timing diagram showing data being written into SRAM cell 10-22. During a time period T1, before data is to be written into cell 10-22, data signal DATA-2 (received from an external source) is a binary zero. Accordingly, output signal RSR from resonant circuit 40 is coupled via switch S20n-2 to bit line WBITn-2, while bit line WBIT-2 is held at a binary zero voltage by its associated keeper circuit K. At the beginning of time period T2, data signal DATA-2 goes to a binary 1 state. Switch S20-2 turns on and switch S20n-2 turns off at a time when signal RSR is at a voltage corresponding to a binary 0, and thereafter, write bit line WBITn-2 is held at a binary 0 by its associated keeper circuit K, while switch S20-2 couples signal RSR to bit line WBIT-2. During time T2, a pulse P is applied to write word line WWD-2 to turn on switches S10 and S11 within cell 10-22 to thereby store data in cell 10-22. In particular, a binary 1 is applied to the input lead of inverter INV2 within cell 10-22, and a binary 0 is applied to the input lead of inverter INV1 within cell 10-22. After pulse P, word line WWD-2 goes low, write bit lines WBIT-2 and WBITn-2 are decoupled from cell 10-22, and cell 10-22 is left in a state corresponding to data signal DATA-2. (Cells 10-21 and 10-23 simultaneously store data corresponding to data signals DATA-1 and DATA-3 in response to pulse P.)

At time periods T4 and T9, data signal DATA-2 becomes a binary 0 and a binary 1 respectively, thereby causing switches S-22 and Sn-22 to change state, and changing whether signal RSR is applied to bit line WBIT-2 or WBITn-2. Since a write pulse is not applied to word line WWD-2, this does not affect cell 10-22.

Figure 1:
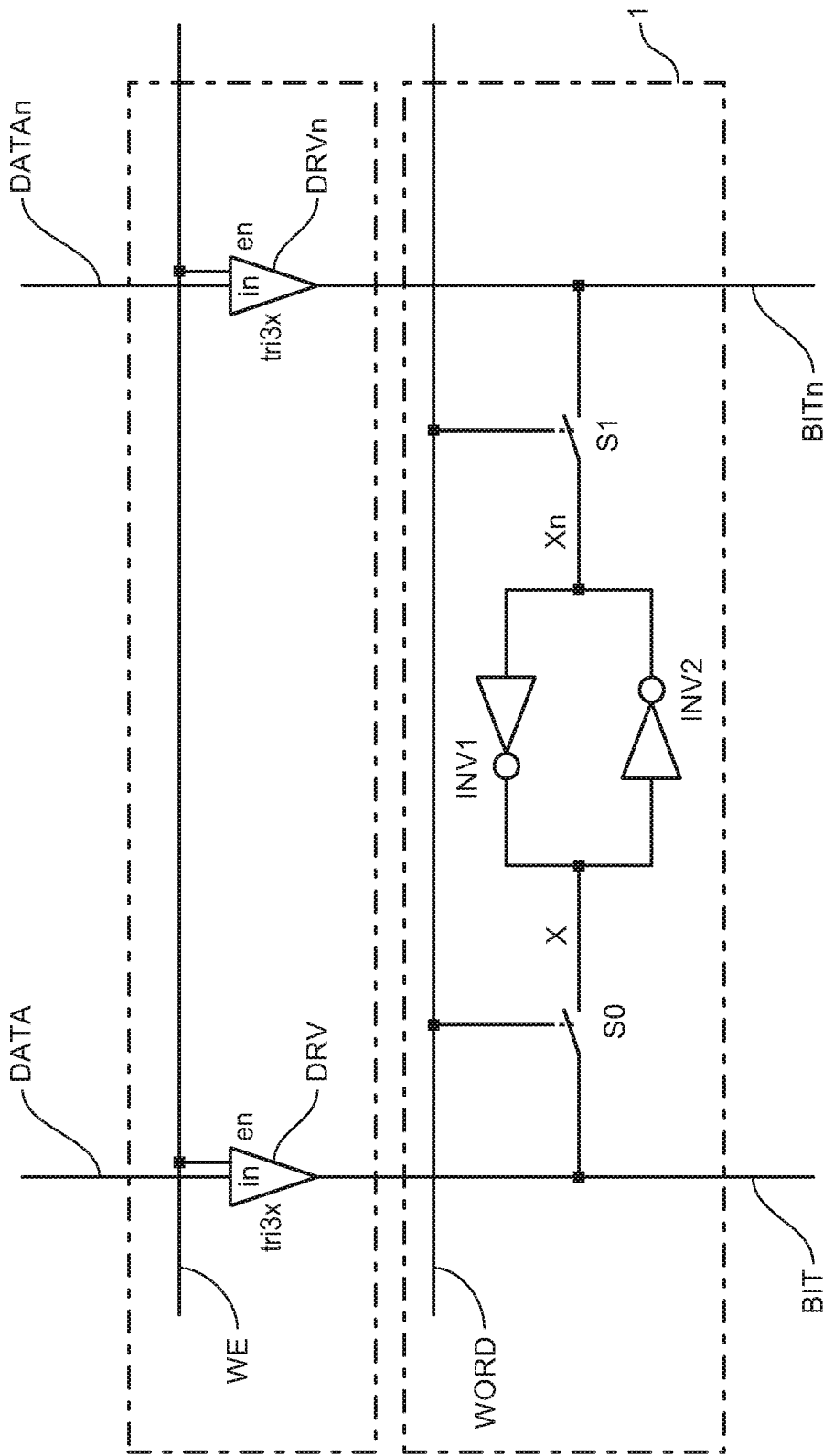
FIG. 1 is a simplified block diagram of a prior art SRAM cell.
Figure 2:
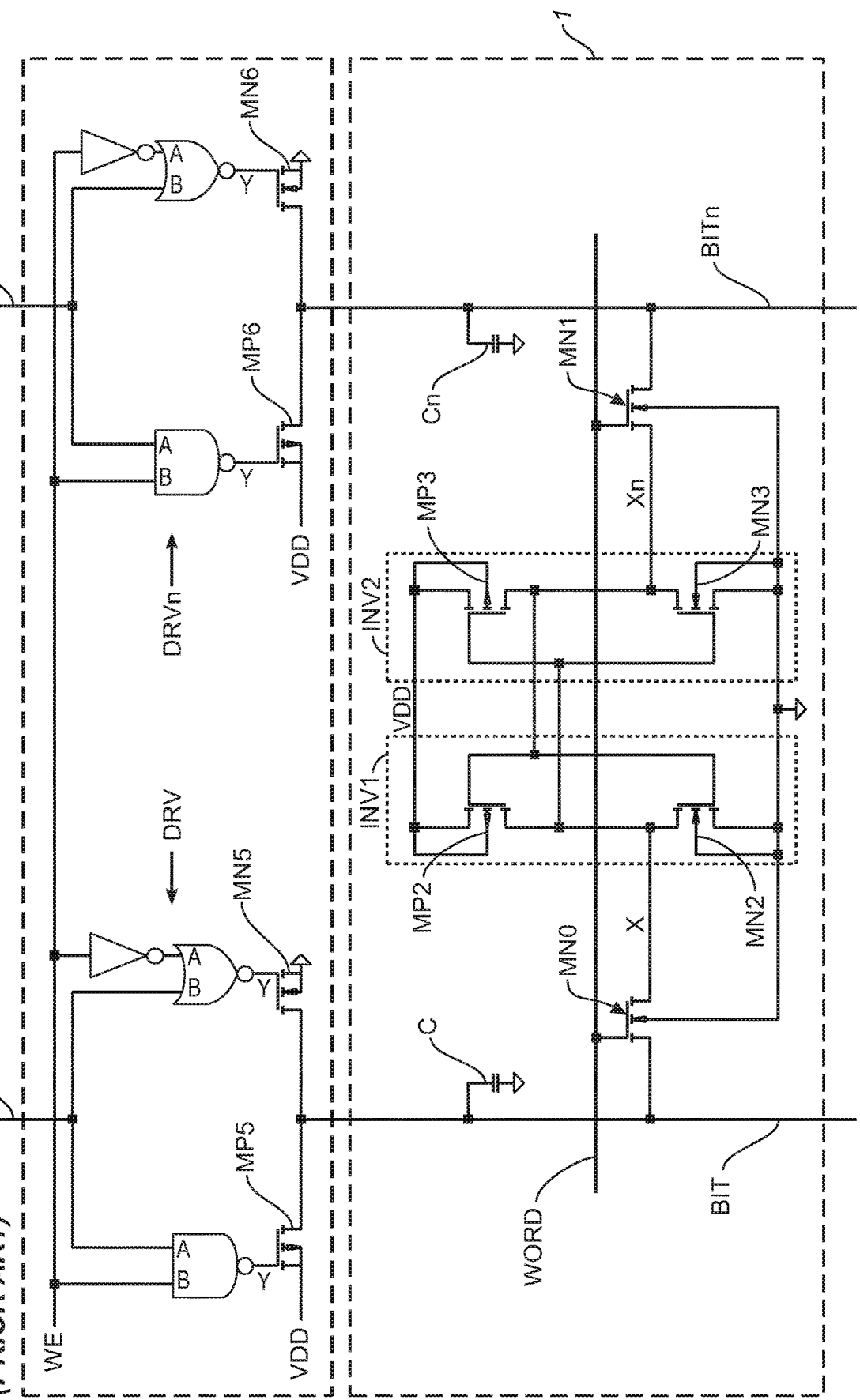
FIG. 2 schematically illustrates the SRAM cell of FIG. 1 in transistor-level detail.

It will be appreciated that write bit lines WBIT-1, WBIT-2, WBIT3, WBITn-1, WBITn-2 and WBITn-3 are not driven from one rail voltage to another rail voltage by CMOS transistor switches (as is done in prior art arrays of cell 1). For example, write bit lines WBIT, WBITn are not driven from one rail voltage to another rail voltage by transistors such as MN5, MN6, MP5 and MP6 (FIGS. 2 and 3). If prior art bit line BIT (or BITn) is charged to a voltage V and then discharged by driver DRV (or DRVn), an amount of energy equal to $\frac{1}{2} CV^2$ (where C is the capacitance of bit line BIT or BITn) is dissipated. By driving bit lines WBIT, WBITn with a resonant circuit instead of CMOS driver circuits DRV, DRVn, this energy dissipation is avoided. Thus, the power consumption associated with driver circuits DRV, DRVn is avoided.

As mentioned above, switches S20-1, S20-2, S20-3, S20n-1, S20n-2 and S20n-3 switch when signal RSR is at a voltage corresponding to a binary zero in response to data signals DATA-1, DATA-2 and DATA-3. Thus, data signals DATA-1 to DATA-3 are synchronized to switch when signal RSR is at the binary zero voltage level. Similarly, the pulses on word lines WWD-1 to WWD-3 are synchronized to occur when signal RSR is at or near its peak voltage (which corresponds to a binary one). Appropriate timing control for these signals is discussed below.

In an alternative embodiment, switches S20-1, S20-2, S20-3, S20n-1, S20n-2 and S20n-3 switch when resonating signal RSR is at a voltage corresponding to a binary 1. This will also avoid discontinuities in resonating signal RSR. In such an embodiment, keeper circuits K (or alternatively switches S30 or high value resistors) maintain their corresponding bit lines at a binary 1 level and word lines WWD-1, WWD-2 and WWD-3 are pulsed when signal RSR is at a voltage corresponding to a binary 0 level.

In embodiments in which the keeper circuits K maintain the write bit lines at a binary 1 voltage level using a switch instead of two inverters INV11, INV12 (e.g. in a manner similar to that shown in FIG. 9), such switches are provided to couple their associated bit lines to a binary 1 voltage level. In embodiments that use large resistors instead of such switches or inverters INV11 and INV12, such resistors can be provided between their associated write bit lines and the binary 1 voltage level. Typically, the resistance value is selected so that only a small current to overcome leakage current, e.g. about 2 nA flow therein.

Resonant Circuit for Driving Bit Lines

Figure 12:
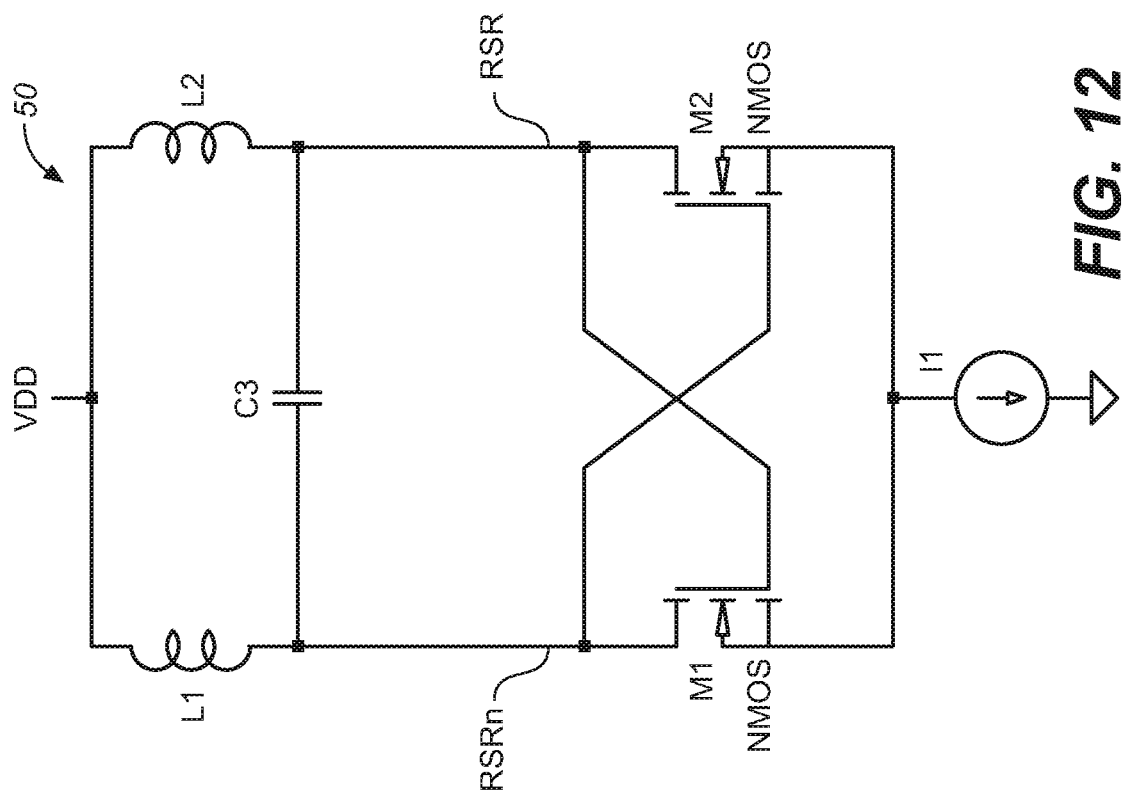
FIG. 12 illustrates an LC resonating circuit using MOS transistors.
Figure 11:
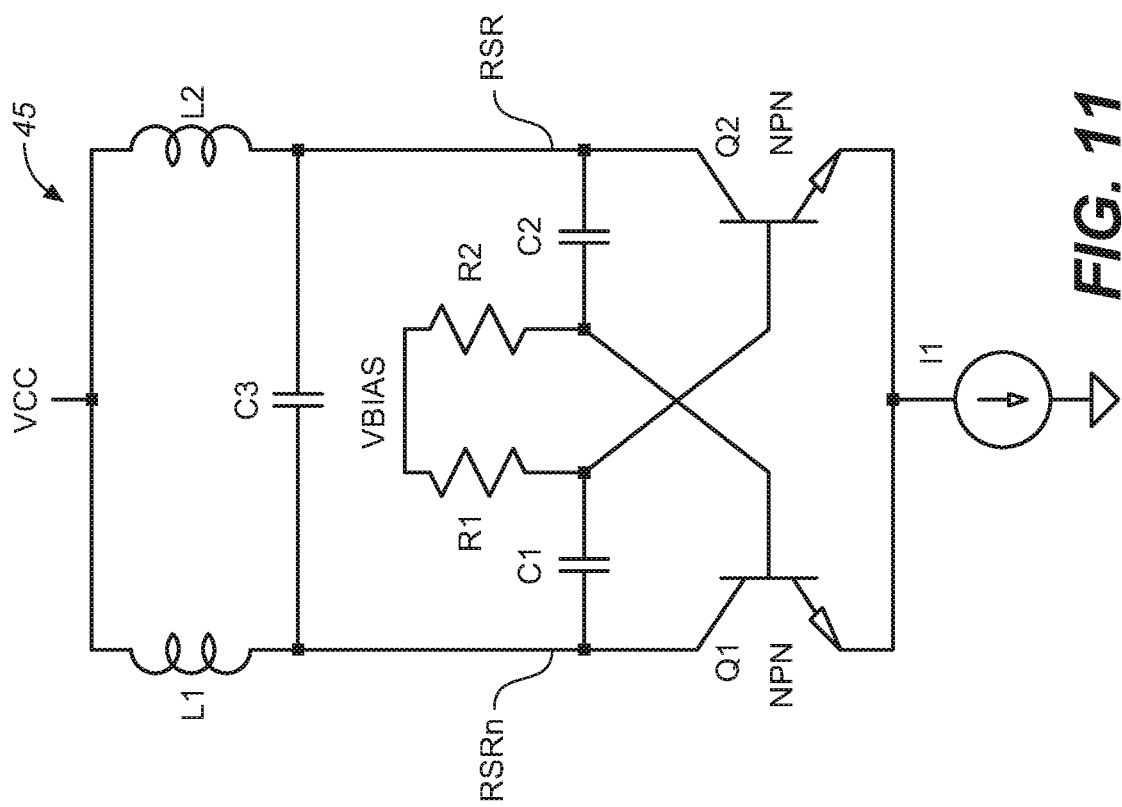
FIG. 11 illustrates an LC resonating circuit using bipolar transistors.

One type of resonant circuit comprises an inductor and capacitor in a series or parallel configuration. FIGS. 11 and 12 illustrate examples of resonators 45 and 50 comprising inductors and capacitors, and using bipolar and MOS transistors, respectively. LC resonant circuits are well-known in the art. Such resonant circuits can be used as circuit 40 to provide resonating signal RSR. In some embodiments, capacitor C3 in FIG. 11 may be unnecessary if the capacitive loading of the SRAM itself (and other associated circuitry) is sufficiently large to resonate with the inductor at an appropriate frequency.

Capacitors store energy in the electric field across the two plates. Inductors store energy in magnetic flux linkages which circulate around the a carrying current. By connecting the capacitor and inductor in series or parallel, a "tank" circuit is created whereby energy can be alternately stored either on the capacitor or the inductor as current moves charge back and forth between the two components. Maximum energy is stored on the capacitor when the current equals zero. Maximum energy is stored on the inductor when the current reaches a peak. The only energy losses (neglecting "radiant" energy) come from heat dissipation from any parasitic resistance found in the signal path. In contrast, all of the energy associated with a capacitor switching from supply potential to ground potential is lost to heat (e.g. as is caused when transistors MN5, MN6, MP5 and MP6 charge and discharge capacitance C, Cn in prior art cell 1). Thus, using a resonant circuit offers a significant advantage in terms of a circuit's power efficiency.

Figure 13:
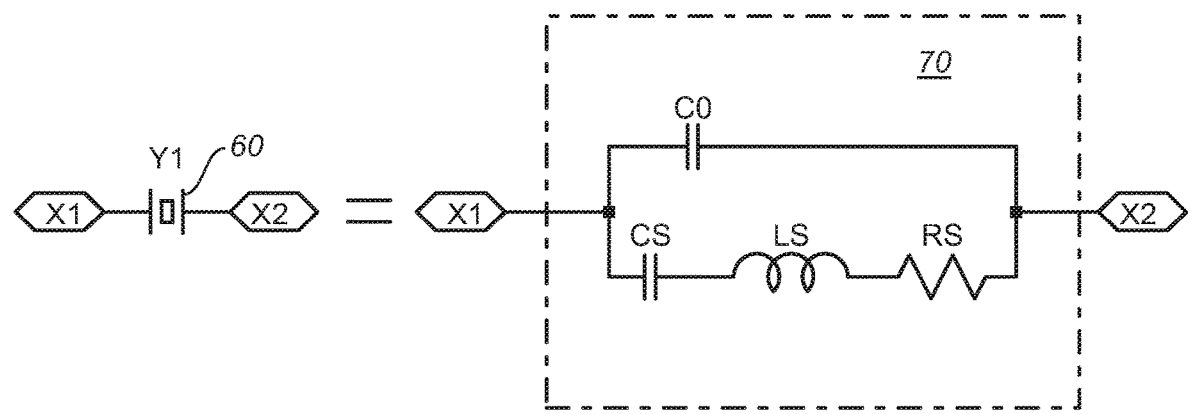
FIG. 13 illustrates the LC equivalent resonant circuit of a typical quartz crystal used in oscillators.
Figure 14:
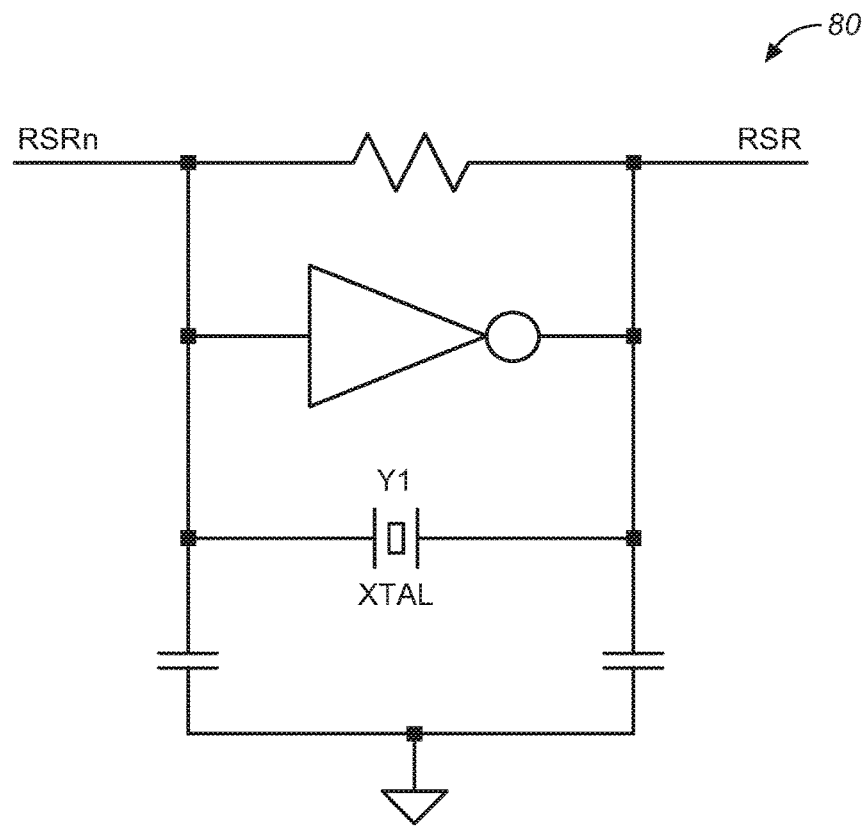
FIG. 14 illustrates a crystal resonating circuit.
Figure 15:
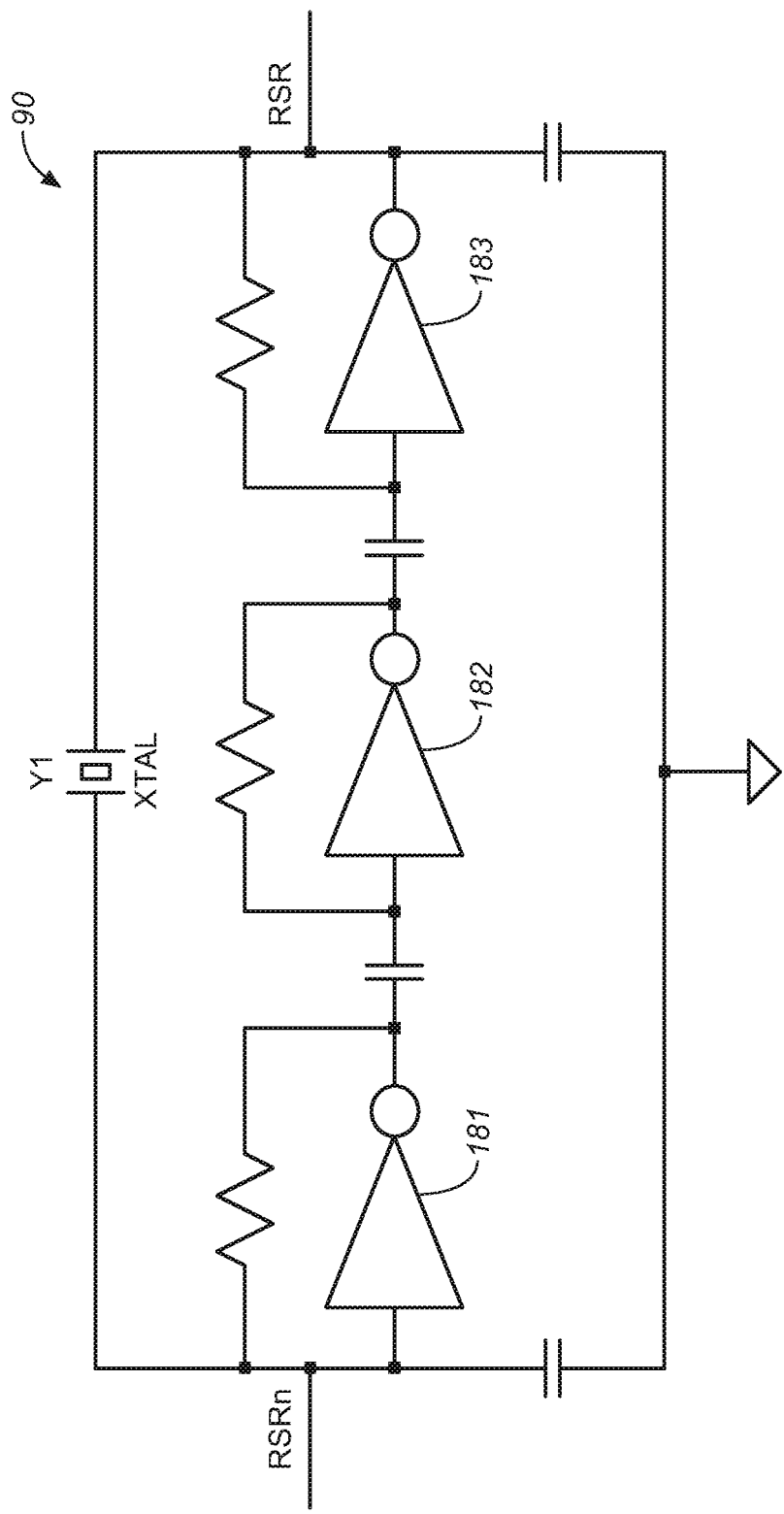
FIG. 15 illustrates another embodiment of a crystal resonating circuit.

A crystal can also be used to resonate in a resonant circuit although that aspect of its behavior that can be modelled as an inductor does not come from a coil, but rather the "motional" inductance of the crystal mass which vibrates when electrically stimulated. One type of well-known crystal resonant circuit is a Pierce Oscillator. FIG. 13 shows a crystal 60 and an RLC equivalent circuit 70. Both the inductor and the capacitor are "energy-storing" elements. (FIGS. 14 and 15 illustrate resonators 80 and 90 comprising crystals. Resonators 80 and 90 are described in my U.S. Provisional Patent Application Ser. No. 62/231,458 entitled "A Pierce Oscillator Using Three Series Inverters", filed on Jul. 6, 2015, and incorporated herein by reference.) Resonators 80 and 90 can also be used as resonant circuit 40 to generate signal RSR.

The capacitive loading on output node 41 of resonant circuit 40 cooperates with the capacitance within resonant circuit to establish the resonating frequency of signal RSR (FIG. 8). This capacitive loading includes the capacitance of bit lines WBIT and WBITn coupled to node 41. The capacitive loading on each bit line WBIT is symbolically illustrated as capacitance CWBIT and the capacitive loading of each bit line WBITn is symbolically illustrated as capacitance CWBITn. It is desirable that these capacitances CWBIT and CWBITn are nearly equal. Otherwise the frequency of resonant circuit 40 will change based on the formula:

$$\omega_0 \approx \frac{1}{\sqrt{LC}}$$

(The switch resistance and other parasitic resistances will offset the frequency from the ideal $\omega_0$.)
In this formula "C" represents the total effective capacitance seen by the resonant tank circuit in parallel with the inductor (or the crystal circuit), and includes capacitances CWBIT, CWBITn of those write bit lines to which circuit 40 is coupled.

It will be appreciated that the total number of selected write bit lines WBIT, WBITn in the embodiment of FIG. 8 does not change as data signals DATA change. This also tends to maintain the capacitance loading on output node 41 of resonant circuit 40 at a constant value.

Circuitry for Generating Timing Control Signals

As mentioned above, data signals DATA and switches S20 and S20n change state at a time when resonating signal RSR is at a binary 0 voltage. This prevents discontinuities in the voltage of the load driven by resonant circuit 40. Appropriate timing control for changing the state of switches S20 and 520n and for generating the signals on write word lines WWD and RWD can be generated in any of a number of ways. For example, in one embodiment, data signals DATA are generated by a microprocessor (not shown) whose quadrature clock is derived from signal RSR (i.e. whose clock is phase shifted by 90 degrees from the point where signal RSR is halfway between peak values). In such an embodiment, the microprocessor changes the state of signals DATA when signal RSR is at a binary 0 voltage, which thereby causes switches S20 and 520n to switch when signal RSR is at a binary 0 voltage.

Alternatively, if data signals DATA come from a source 102 that is not synchronized with signal RSR, in one embodiment a phase locked loop 100 (FIG. 16), coupled to receive sinusoidal signal RSR and its sinusoidal inverse RSRn from resonant circuit 40, provides a control signal to latches 104, which latches data signals DATA at a time when signal RSR is low. The contents of latches 104 control switches S20 and 520n.

Figure 17:
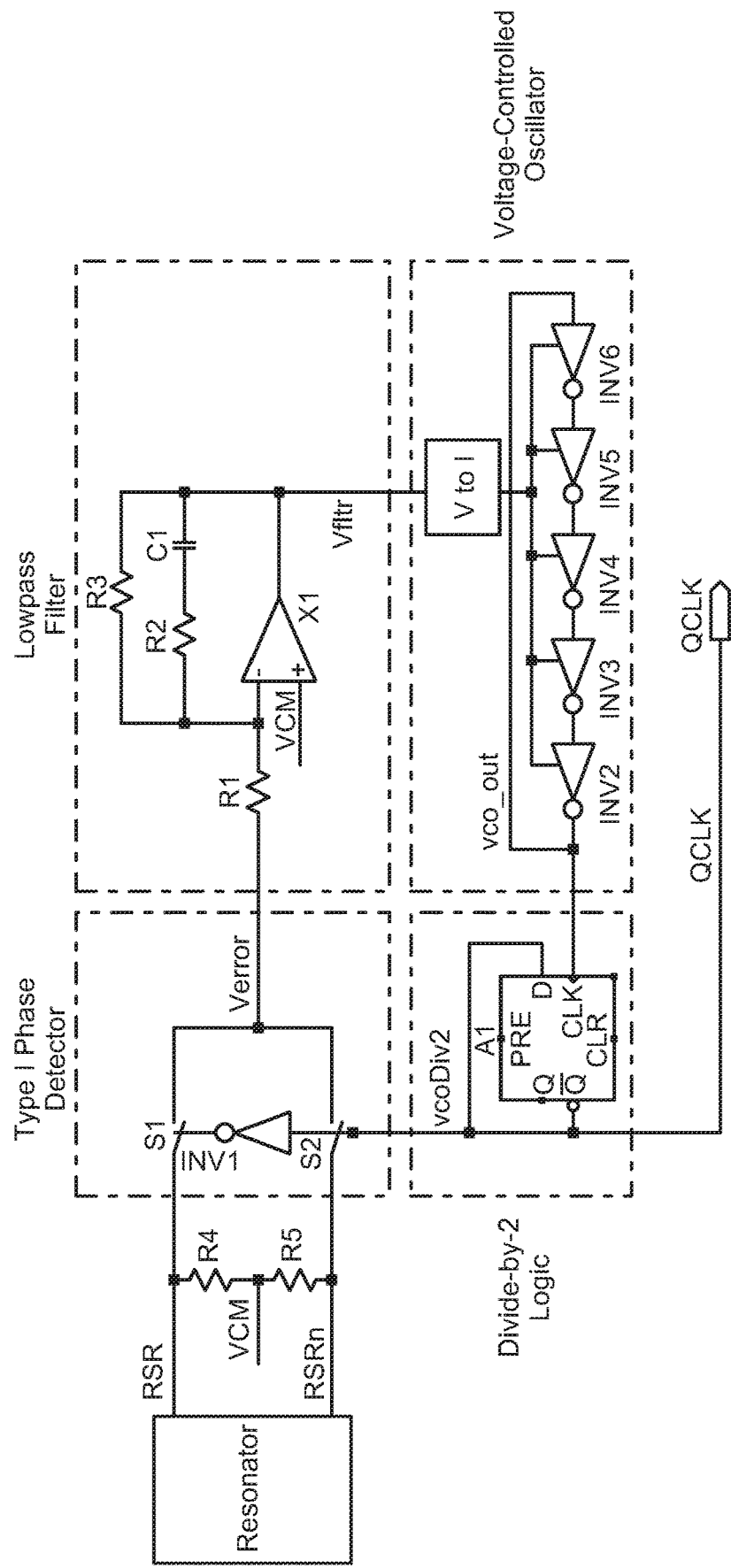
FIG. 17 is a more detailed schematic illustration of an example of a phase locked loop that can be used in conjunction with an embodiment of my invention.

Phase locked loops are well-known in the art. In one embodiment, phase locked loop 100 comprises a phase detector 106, a low pass filter 108, a voltage-controlled oscillator 110, and divide-by-two logic circuit 112. FIG. 17 illustrates a more detailed example of circuitry that can be used for phase-locked loop 100. However, other types of phase-locked loops can also be used.

Alternatively, a programmable delay circuit or a delay locked loop circuit can be used in lieu of phase locked loop 100. Delay locked loops and programmable delay circuits are also well known in the art.

Figure 16:
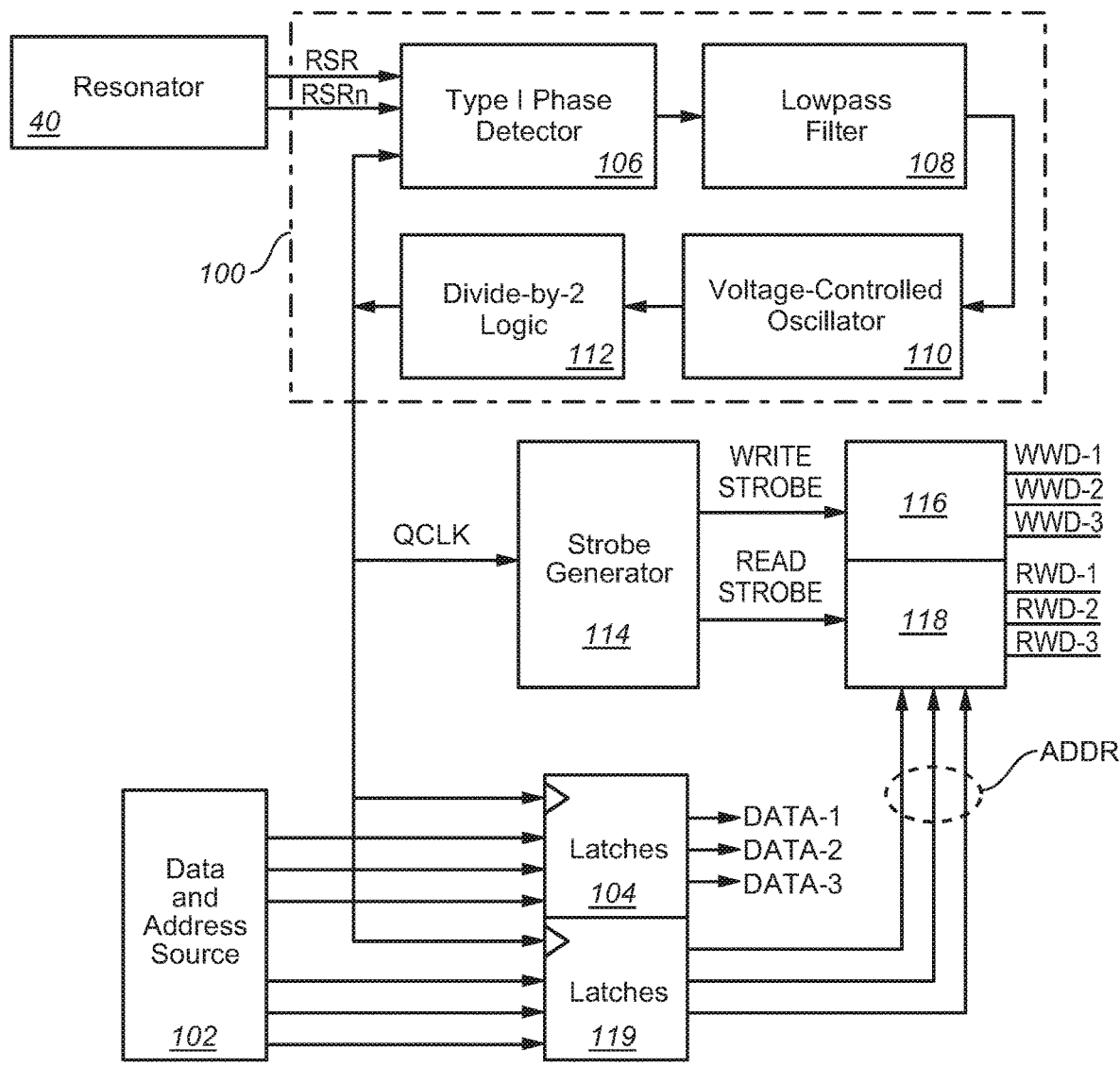
FIG. 16 illustrates a phase locked loop circuit for generating timing control signals for use in conjunction with an embodiment of my invention.

FIG. 16 also illustrates a strobe generator 114 for generating pulses which, in turn are used to generate timing control for the word line pulses on write word lines WWD and read word lines RWD. Strobe generator 114 provides pulses to a write address decoder 116 and a read address decoder 118. Write and read address decoders 116, 118 receive address signals ADDR from external source 102 via laches 119 and generate pulses on word lines WWD and RWD as appropriate. (Address signals ADDR are synchronized with signal RSR in a manner similar to data signals DATA-1 to DATA-3.) As mentioned above, the address decoders can be as described in my above-incorporated U.S. Provisional Patent Application entitled "A Low Power Decoder Using Resonant Drive Circuitry".

Figure 18:
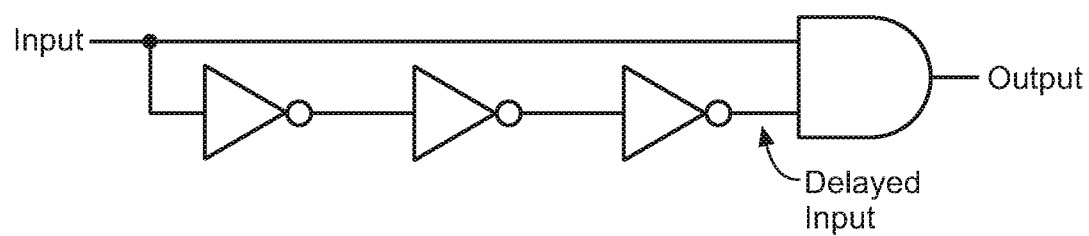
FIG. 18 illustrates a strobe generator used in accordance with an embodiment of my invention.
Figure 19:
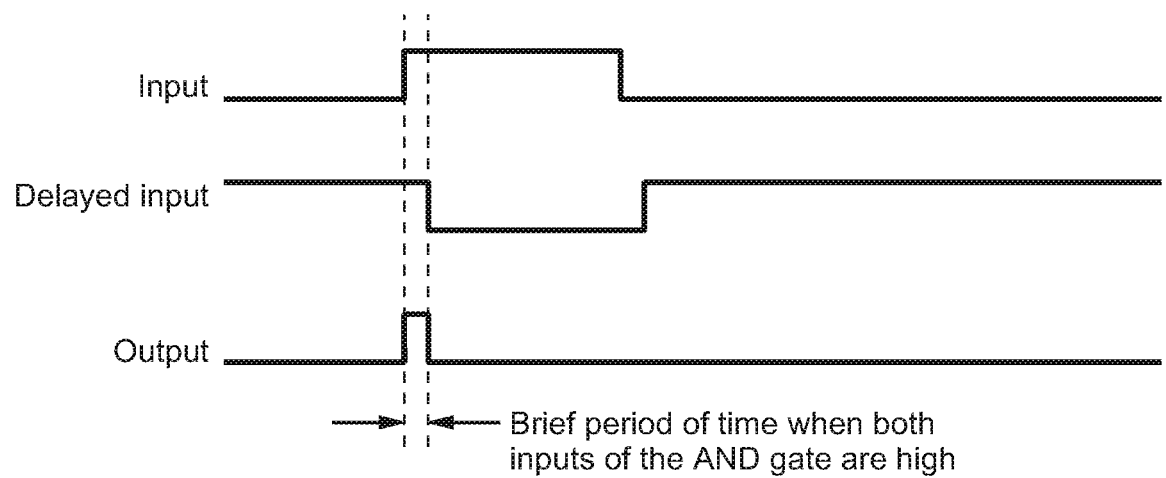
FIG. 19 illustrates a timing diagram illustrating signals in the strobe generator of FIG. 18.

FIG. 18 illustrates an example of a strobe generator that can be used in accordance with my invention, and FIG. 19 is a timing diagram showing various signals within strobe generator of FIG. 18. Strobe generators are well-known in the art. Other techniques can also be used for generating appropriate timing signals.

Rail Voltages

In one embodiment, the circuitry of SRAM array 20 uses a single set of rail voltages (e.g. 0 and 2 volts), and resonant circuit 40 oscillates between 0 and 2 volts. However, other rail voltage values can also be used, and different parts of the SRAM circuitry can use different rail voltages.

For example, in another embodiment, the inverters in SRAM cells 10 use rail voltages of 1 and 2 volts, and therefore the rail voltages for the read bit lines RBIT-1, RBIT-2, RBIT-3, RBITn-1, RBITn-2 and RBITn-3 are 1 and 2 volts. In this embodiment, the read bit lines are typically coupled to sense amplifiers SA-1 to SA-3 (FIG. 8) that differentially amplify the read bit line voltages to provide output signals DOUT-1 to DOUT-3 having rail voltages of 0 and 3 volts. Each read bit line within a pair is typically coupled to the other read bit line within that pair (for example, bit line RBIT-2 is coupled to bit line RBITn-2 via a switch S22-2) and is at an intermediate voltage, for example 1.5 V, except during read cycle. This reduces the amount of time required for the read bit line voltages to increase or decrease to their desired rail voltage during a read cycle. Also, in this embodiment, resonant circuit 40 oscillates between 0 and 3 volts and keeper circuits K use rail voltages of 0 and 3 volts.

The embodiment described above using different rail voltages has a number of advantages. First, because the voltage swing of signal RSR exceeds the rail voltages of inverters INV1 and INV2 of SRAM cells 10, the timing requirements for the write pulse P are more relaxed than they would be if the voltage swing of signal RSR equaled the rail voltages of inverters INV1 and INV2. This is because there is a wider time period during which signal RSR is at an appropriate value for driving inverters INV1 and INV2.

Further, because the voltage swing of signal RSR exceeds the rail voltages of inverters INV1 and INV2 of SRAM cells 10, transistors MN10 and MN11 can be smaller than would be necessary if the voltage swing of signal RSR equaled the rail voltages of inverters of INV1 and INV2. This is because the greater voltage swing of signal RSR allows a greater tolerance of higher on-resistance for transistors MN10 and MN11.

As mentioned above, the above-described examples are merely illustrative, and different rail voltages and voltage swings can be used in conjunction with the present invention. Further, in some embodiments, the voltage swing of signal RSR equals the rail voltages of inverters INV1 and INV2 and keeper circuits K.

Alternate Embodiment Using One Write Bit Line

An alternative embodiment of my invention uses one write bit line WBIT and one switch S10 for writing into an SRAM cell (i.e. without including switch S11 and bit line WBITn). In this embodiment, it is not necessary to include resistor R2, since there will be no contention between the signal on line WBITn and the output signal of inverter INV2. In this embodiment, one can apply binary DC voltages drivers such as drivers DRV, DRVn discussed above.

Alternatively, one can use a resonator to drive the bit line, and turn on switch S10 when signal RSR is high (if one wants to write a binary one) or low (if one wants to write a binary 0). Thus, this embodiment comprises controlling the timing of switch S10 to determine what binary value is being written into the cell.

Alternatively, one can use a single write bit line and couple that write bit line either to signal RSR or a first binary voltage level (depending upon the data being written into the cell), and coupling that write bit line to the cell when signal RSR is at a second binary voltage level opposite the first binary voltage level.

While the invention has been described in detail, those skilled in the art will appreciate that changes can be made in form and detail without departing from the spirit and scope of the invention. For example, different aspects of the invention can be practiced independently of other aspects of the invention. Thus, in one embodiment, an SRAM array comprises resistors such as resistors R1, R2 to reduce power consumption during writing but does not use a resonant circuit to drive the write bit lines. In another embodiment, a resonant circuit drives the write bit lines but does not include resistors R1, R2. Different voltage and resistance values can be used. An SRAM cell in accordance with my invention can be incorporated into arrays of different sizes, having different numbers of rows and columns. The SRAM cell can be used by itself, in an array of one row, or an array of one column. Different cells within the array can employ the invention, while other cells do not. Different types of resonators, including crystal and LC resonators, can be used in conjunction with the invention. Different types of resonating materials can be used (e.g. as described in U.S. Pat. No. 7,183,868, issued to Wessendorf, col. 7, lines 6-24, incorporated herein by reference). In some embodiments, the capacitance of the write bit lines enables the resonator to resonate. Address and data signals can be provided by different types of devices. The various switches can be implemented using a single N channel transistor (e.g. such as transistors MN10 to MN14) or parallel-connected pairs of N and P channel transistors. Accordingly, all such modifications come within the present invention.

I claim:

1. Structure comprising:
    a resonant circuit for providing a resonating output signal on a resonator output lead;
    an SRAM cell comprising a first input lead and a second input lead; and
    a set of switches for providing said resonating output signal on said first input lead and a static binary voltage on said second input lead to store a first value in said SRAM cell, and for providing said resonating output signal on said second input lead and said static binary voltage on said first input lead to store a second value in said SRAM cell opposite said first value.

2. Structure of claim 1 wherein said SRAM cell comprises:
    a first inverter, said first input lead being the input lead of said first inverter, said first inverter having an output lead;
    a second inverter, said second input lead being the input lead of said second inverter, said second inverter having an output lead;

a first resistor coupled between the output lead of the second inverter and the input lead of the first inverter;
a second resistor coupled between the output lead of the first inverter and the input lead of the second inverter;
said first resistor reducing contention between the signal on said first input lead and the output signal of said second inverter, said second resistor reducing contention between the signal on said second input lead and the output signal of said first inverter.

3. Structure of claim 2 wherein said set of switches comprises first, second, third and fourth switches, said structure further comprising:
a first bit line, said first switch being coupled between the input lead of the first inverter and said first bit line;
a second bit line, said second switch coupled between the input lead of the second inverter and said second bit line;
and
said third and fourth switches providing said resonating output signal to either said first bit line or said second bit line;
wherein said first and second resistors reduce the amount of current required for writing data into said SRAM cell.

4. Structure of claim 1 wherein said resonating output signal is a sine wave.

5. Structure of claim 1 further comprising a data input lead for receiving a data input signal, said set of switches providing said resonating output signal on said first input lead and said static binary voltage on said second input lead to store a first value in said SRAM cell in response to said data input signal being in a first state, said set of switches providing said resonating output signal on said second input lead and said static binary voltage on said first input lead to store a second value in said SRAM cell opposite said first value in response to said data input signal being in a second state opposite said first state.

6. Structure of claim 1 further comprising first and second write bit lines and a data input lead for receiving an input signal, said set of switches comprising:
a first switch for loading data from said first write bit line onto said first input lead of said SRAM cell;
a second switch for loading data from said second write bit line onto said second input lead of said SRAM cell;
a third switch for coupling said resonator output lead to said first write bit line in response to said input signal being in a first state;
a fourth switch for coupling said resonator output lead to said second write bit line in response to said input signal being in a second state opposite said first state;
a fifth switch for applying said binary voltage to said first bit line in response to said input signal being in said second state; and
a sixth switch for applying said binary voltage to said second bit line in response to said input signal being in said first state.

7. Structure of claim 6 wherein the frequency of the resonating output signal is controlled by a total load capacitance of said resonant circuit, at least part of said total load capacitance comprising the capacitance of at least one of said first and second write bit lines, the total load capacitance remaining substantially constant when the write bit line connected to the resonator output lead changes.

8. Structure of claim 1 further comprising:
first and second write bit lines;
a first switch for coupling said resonator output lead to said first write bit line; and
a second switch for coupling said resonator output lead to said second write bit line;
and wherein said SRAM cell is part of a column of SRAM cells, each of said SRAM cells having a switch for coupling a first SRAM cell input lead to said first write bit line and a switch for coupling a second SRAM cell input lead to said second write bit line, data being loaded from said first and second write bit lines into a selected one of said SRAM cells.

9. Structure of claim 8 further comprising a keeper circuit tending to maintain the voltage of said first and second bit lines in a constant state.

10. Structure of claim 6 wherein said resonant circuit comprises a crystal, said first and second write bit lines exhibiting capacitance, the capacitance of at least one of said write bit lines cooperating with said crystal to establish the frequency of said resonant circuit.

11. Structure of claim 6 wherein a plurality of write bit lines are coupled to said resonant circuit, said plurality comprising said first and second write bit lines, the capacitance of said write bit lines coupled to said resonant circuit enabling said resonant circuit to resonate.

12. A method comprising:
providing an SRAM cell having a first input lead and a second input lead;
applying a resonating signal from a resonant circuit to said first input lead and applying a static binary voltage to said second input lead and loading data from said first and second input leads into said SRAM cell to thereby store a first value in said SRAM cell; and
applying said resonating signal to said second input lead and said static binary voltage to said first input lead and loading data from said first and second input leads into said SRAM cell to thereby store a second value in said SRAM cell opposite said first value.

13. Method of claim 12 wherein said SRAM cell comprises first and second inverters, an output lead of said first inverter being coupled via a first resistor to an input lead of said second inverter, an output lead of said second inverter being coupled via a second resistor to an input lead of said first inverter, said first input lead being the input lead of said first inverter, said second input lead being the input lead of said second inverter, said method further comprising:
limiting the amount of current required to write data into said SRAM cell with said first and second resistors.

14. Method of claim 13 wherein said SRAM cell is incorporated into a column of SRAM cells, each of said SRAM cells within said column comprising a first inverter having an input lead and an output lead, a second inverter having an input lead and an output lead, a first resistor coupled between the output lead of said second inverter and the input lead of the first inverter, a second resistor coupled between the output lead of the first inverter and the input lead of the second inverter, said column comprising first and second write bit lines, said method further comprising:
driving one of said first and second write bit lines with said resonating signal, and wherein said act of applying said resonating signal to said first input lead comprises coupling said first bit line to said input lead of said first inverter of one of said SRAM cells within said column, and said act of applying said static binary voltage to said input lead of said second inverter comprises applying said static binary voltage to said second bit line and coupling said second bit line to said input lead of said second inverter of said one cell within said column.

15. Method of claim 12 wherein said SRAM cell is part of an array, said array comprising first and second bit lines, said method further comprising:
receiving a data signal;
applying said resonating signal to said first bit line and applying said static binary voltage to said second bit line in response to said data signal being in a first state, and applying said resonating signal to said second bit line and said static binary voltage to said first bit line in response to said data signal being in a second state;
coupling said first bit line to said first input lead; and
coupling said second bit line to said second input lead.

16. Method of claim 15 wherein said resonant circuit comprises an LC circuit, said first and second bit lines exhibit capacitance, and wherein the capacitance of said bit lines, when coupled to receive said resonating signal, cooperate with said LC circuit to establish the frequency of said resonating signal.

17. Method of claim 16 wherein the capacitance of said bit lines, when coupled to receive said resonating signal, enables said LC circuit to resonate.

18. Method of claim 15 wherein said resonant circuit comprises a crystal, said first and second bit lines exhibit capacitance, and wherein the capacitance of said bit lines, when coupled to receive said resonating signal, cooperate with said crystal to establish the frequency of said resonating signal.

19. Method of claim 15 further wherein a keeper circuits are coupled to said first and second bit lines, said keeper circuits tending to maintain the voltage of said first and second bit lines in a constant state.

20. Method of claim 15 further comprising receiving a data input signal on a data input lead, and wherein said act of applying said resonating signal from said resonant circuit to said first input lead and applying said static binary voltage to said second input lead is accomplished in response to said data input signal being in a first state, and said applying said resonating signal to said second input lead and said static binary voltage to said first input lead is accomplished in response to said input data input signal being in a second state opposite said first state.

21. Structure comprising:
a resonant circuit for providing a resonating output signal on a resonator output lead;
an SRAM cell comprising a first input lead, said resonating signal resonating between a first voltage interpreted by said SRAM cell as a logical zero and a second voltage interpreted by said SRAM cell as a logical one; and
a first switch for coupling said resonator output lead to said first input lead to thereby store data in said SRAM cell.

22. Structure of claim 21 wherein said SRAM cell further comprises a second input lead and said first switch is part of a set of switches, said set of switches applying said resonating signal to said first input lead when said resonating signal is at one of said first and second voltages, said set of switches applying a static voltage that is at the other of said first and second voltages to said second input lead to store data in said SRAM cell.

23. Structure of claim 22 further comprising a data input lead for receiving an input signal, said set of switches providing said resonating signal to said first input lead and said static voltage at said second input lead in response to said input signal being in a first state, and providing said resonating signal at said second input lead and said static voltage to said first input lead in response to said input signal being in a second state opposite said first state.

24. A method comprising:
providing an SRAM cell having a first input lead;
applying a resonating signal from a resonant circuit to said first input lead, said resonating signal resonating between a first voltage interpreted by said SRAM cell as a logical zero and a second voltage interpreted by said SRAM cell as a logical one; and
loading data from said first input lead into said SRAM cell.

25. Method of claim 24 wherein said SRAM cell has a second lead, said loading being accomplished when said resonating signal is at one of said first and second voltages, said method further comprising applying a static voltage that is at the other first and second voltages during said act of loading.

26. Method of claim 25 further comprising:
receiving a data input signal on a data input lead;
applying said resonating signal on said first input lead and applying said static voltage on said second input lead in response to said data input signal being in a first state; and
applying said resonating signal on said second input lead and applying said static voltage on said first input lead in response to said data input signal being in a second state opposite said first state.

27. Structure comprising:
a data input lead for receiving an input signal;
a resonant circuit for providing a resonating output signal on a resonator output lead;
an SRAM cell;
first and second leads for providing data to said SRAM cell;
a first switch for coupling said resonator output lead to said first lead in response to said input signal being in a first state to store a first value in said SRAM cell; and
a second switch for coupling said resonator output lead to said second lead in response to said input signal being in a second state opposite said first state to thereby store a second value opposite said first value in said SRAM cell, wherein said first and second switches change state in response to said input signal changing state at a time when said resonating signal is at a voltage interpreted by said SRAM cell as a binary voltage.

28. Structure of claim 27 further comprising a third switch for coupling a static voltage to said first lead in response to said input signal being in said second state, and a fourth switch for coupling said static voltage to said second lead when said input signal is in said first state, said first, second, third and fourth switches changing state when said resonating signals is at said binary voltage.

29. Structure of claim 28 wherein said first lead is a first bit line and said second lead is a second bit line, said structure further comprising a fifth switch for coupling said first bit line to a first input lead of said SRAM cell and a sixth switch for coupling said second bit line to a second input lead of said SRAM cell.

30. A method comprising:
providing an SRAM cell and first and second leads for communicating data to said SRAM cell;
receiving an input signal;
applying a resonating signal from a resonant circuit to said first lead in response to said input signal being in a first state; and
switching application of said resonating signal from said first lead to said second lead in response to said input signal changing to a second state when said resonating signal is at a voltage interpreted by said SRAM cell as a binary voltage.

31. Method of claim 30 further comprising:

applying a static voltage to said second lead when said input signal is in said first state; and switching application of said static voltage from said second lead to said first lead in response to said input signal changing to said second state when said resonating signal is at said binary voltage.

32. Method of claim 31 where said first lead is a first bit line and said second lead is a second bit line, said method further comprising coupling said first bit line to a first input lead of said SRAM cell and coupling said second bit line to a second input lead of said SRAM cell to thereby store data in said SRAM cell.

* * * * *